US012573437B2

(12) United States Patent (10) Patent No.: US 12,573,437 B2
Jung (45) Date of Patent: Mar. 10, 2026

(54) STORAGE DEVICE FOR GENERATING A DELAY SIGNAL, AND A METHOD OF OPERATING THE SAME

(71) Applicant: SAMSUNG ELECTRONICS CO., LTD., Suwon-si (KR)

(72) Inventor: Laesang Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 151 days.

(21) Appl. No.: 18/635,071

(22) Filed: Apr. 15, 2024

(65) Prior Publication Data

US 2025/0046354 A1    Feb. 6, 2025

(30) Foreign Application Priority Data

Aug. 2, 2023    (KR) ........................ 10-2023-0101214

(51) Int. Cl.
*G11C 7/22*    (2006.01)
*G11C 7/10*    (2006.01)
(52) U.S. Cl.
CPC ............ *G11C 7/227* (2013.01); *G11C 7/1063* (2013.01); *G11C 7/222* (2013.01)
(58) Field of Classification Search
CPC ........ G11C 7/227; G11C 7/1063; G11C 7/222
See application file for complete search history.

(56) References Cited

U.S. PATENT DOCUMENTS

| | | | |
|---|---|---|---|
| 6,823,293 B2 | 11/2004 | Chen et al. | |
| 7,339,411 B2 | 3/2008 | Yuuki et al. | |
| 7,567,469 B2 | 7/2009 | Lee | |
| 7,599,241 B2 | 10/2009 | Sprouse et al. | |
| 7,882,375 B2 | 2/2011 | Yoon | |
| 8,042,013 B2 | 10/2011 | Eto | |
| 8,140,880 B2 | 3/2012 | Kimura | |
| 8,417,995 B2 | 4/2013 | Davy et al. | |
| 9,218,851 B2 | 12/2015 | Shlick et al. | |
| 9,998,026 B2 | 6/2018 | Siessegger et al. | |
| 10,134,477 B2 | 11/2018 | Park et al. | |
| 2006/0221749 A1 | 10/2006 | Kwean | |
| 2020/0133573 A1* | 4/2020 | Byun | G11C 5/148 |
| 2024/0194279 A1* | 6/2024 | Eliash | G11C 16/0483 |

FOREIGN PATENT DOCUMENTS

| | | |
|---|---|---|
| JP | 2001-016863 | 1/2001 |
| JP | 3317069 | 8/2002 |
| KR | 10-2000-0003195 | 1/2000 |
| KR | 10-2002-0018387 | 3/2002 |

* cited by examiner

*Primary Examiner* — Han Yang
(74) *Attorney, Agent, or Firm* — Morgan, Lewis & Bockius LLP

(57) ABSTRACT
A method of operating a storage device which communicates with a host device, the method including: detecting a first power signal provided from the host device; determining whether a time interval between the detection of the first power signal and a most recent shutoff of the first power signal exceeds a reference time interval; generating a dummy delay signal in response to determining that the time interval exceeds the reference time interval; and managing a first subsequent memory operation based on the dummy delay signal.

20 Claims, 15 Drawing Sheets

Figure 2:
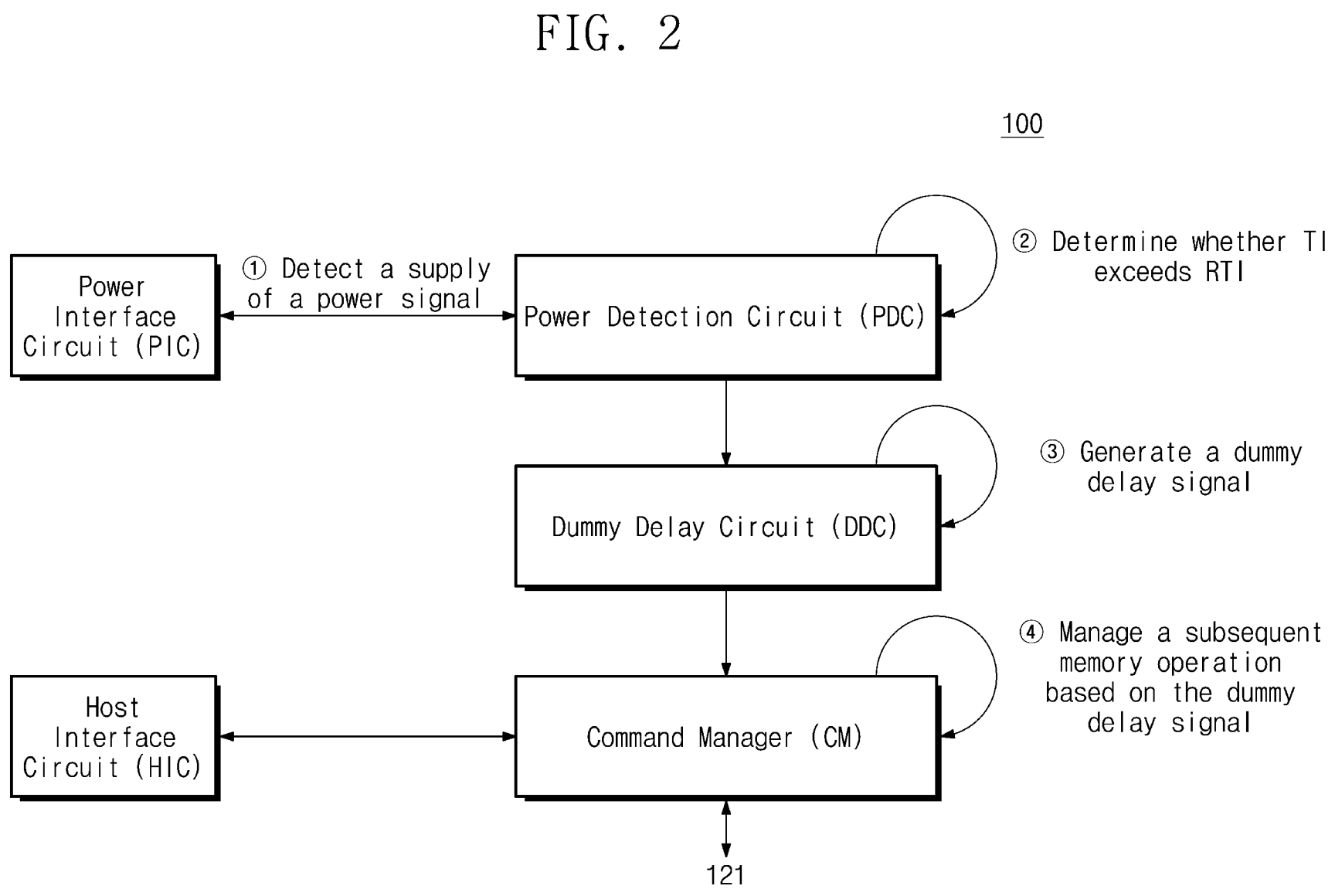

① Detect a supply of a power signal

② Determine whether TI exceeds RTI

③ Generate a dummy delay signal

④ Manage a subsequent memory operation based on the dummy delay signal

Power Interface Circuit (PIC)

Power Detection Circuit (PDC)

Dummy Delay Circuit (DDC)

Command Manager (CM)

121

Host Interface Circuit (HIC)

Figure 14:
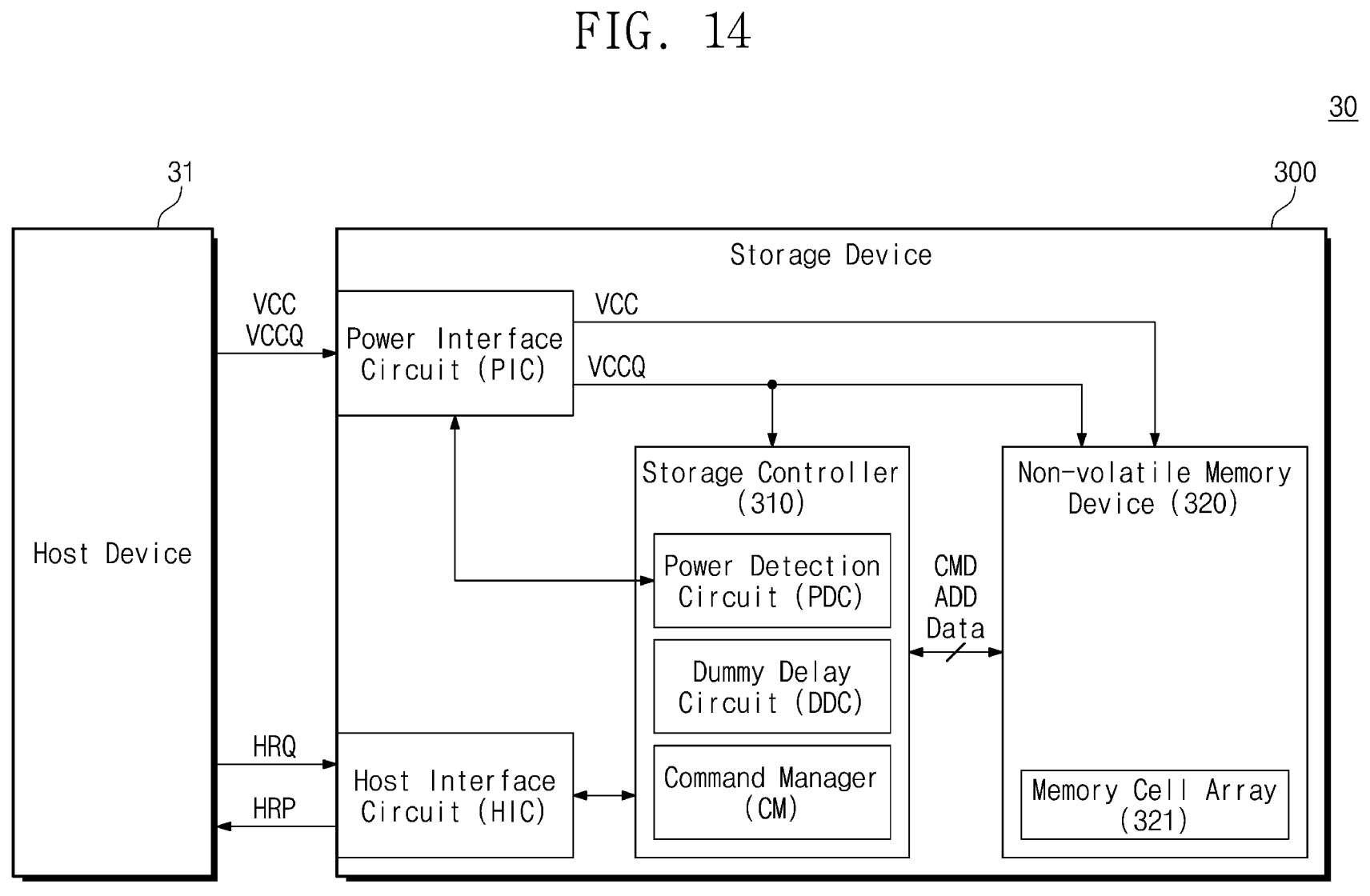

Host Device

VCC
VCCQ

HRQ
HRP

Storage Device

300

Power Interface Circuit (PIC)

VCC

VCCQ

Host Interface Circuit (HIC)

Storage Controller (310)

Power Detection Circuit (PDC)

Dummy Delay Circuit (DDC)

Command Manager (CM)

CMD
ADD
Data

Non-volatile Memory Device (320)

Memory Cell Array (321)

Storage Device (300)

Storage Controller (310)          Non-volatile Memory
                                  Device (320)

Detect a supply of a power signal
from a host device by monitoring PIC
(S310)

Determine that CCN exceeds RCN
(S320)

Generate a dummy delay signal
(S330)

Manage a subsequent memory operation based on the dummy delay signal
(S340)

STORAGE DEVICE FOR GENERATING A DELAY SIGNAL, AND A METHOD OF OPERATING THE SAME

CROSS-REFERENCE TO RELATED APPLICATION

This application claims priority under 35 U.S.C. § 119 to Korean Patent Application No. 10-2023-0101214 filed on Aug. 2, 2023, in the Korean Intellectual Property Office, the disclosure of which is incorporated by reference herein in its entirety.

TECHNICAL FIELD

Embodiments of the present disclosure described herein relate to a storage device, and more particularly, to a storage device for generating a delay signal and a method of operating the same.

DISCUSSION OF RELATED ART

A memory device is designed to store data in response to a write request and to output stored data in response to a read request. The memory device can be categorized into two types: volatile and non-volatile memory. Volatile memory devices, such as dynamic random access memory (DRAM) or static RAM (SRAM), lose their stored data when power is turned off. On the other hand, non-volatile memory devices, such as flash memory, phase-change RAM (PRAM), magnetic RAM (MRAM), and resistive RAM (RRAM), retain their stored data in the absence of power.

The non-volatile memory device may be used as a storage medium for a large amount of data. This device retains its stored data even when its power is turned off. When the power of the storage device is turned on, the storage device may perform various memory operations such as a read operation, a write operation, and a reliability operation. The cycles of power-on and power-off of the storage device may lead to changes in its physical environment. These changes may cause reductions in performance such as reduced data reliability, or delays or failures in subsequent memory operations. To mitigate these issues, a technique for managing the storage device based on a supply condition of the power may be employed.

SUMMARY

Embodiments of the present disclosure provide a storage device for generating a delay signal and a method of operating the same.

According to an embodiment of the present disclosure, there is provided a method of operating a storage device which communicates with a host device, the method including: detecting a first power signal provided from the host device; determining whether a time interval between the detection of the first power signal and a most recent shutoff of the first power signal exceeds a reference time interval; generating a dummy delay signal in response to determining that the time interval exceeds the reference time interval; and managing a first subsequent memory operation based on the dummy delay signal.

According to an embodiment of the present disclosure, there is provided a storage device including: a power interface circuit configured to receive a first power signal and a second power signal from a host device; a storage controller driven by the second power signal; and a non-volatile memory device driven by the first and second power signals, wherein the non-volatile memory device includes: a power detection circuit configured to detect a supply of at least one power signal among the first and second power signals and to generate a comparison signal indicating whether a time interval between the supply of the at least one power signal and a previous shutoff of the at least one power signal exceeds a reference time interval; and a dummy delay circuit configured to generate a dummy delay signal based on the comparison signal.

According to an embodiment of the present disclosure, there is provided a storage device including: a power interface circuit configured to receive a first power signal and a second power signal from a host device; a storage controller driven by the second power signal; and a non-volatile memory device driven by the first and second power signals, wherein the storage controller includes: a power detection circuit configured to detect the first power signal by monitoring the power interface circuit and to generate a detection signal based on whether a time interval between the detection of the first power signal and a last shutoff of the first power signal exceeds a reference time interval; and a dummy delay circuit configured to generate a dummy delay signal based on the detection signal.

BRIEF DESCRIPTION OF THE DRAWINGS

The above and other features of the present disclosure will become apparent by describing in detail embodiments thereof with reference to the accompanying drawings.

FIG. 1 is a block diagram of a storage system according to an embodiment of the present disclosure.

FIG. 2 is a diagram for describing a method of operating a storage device of FIG. 1, according to some embodiments of the present disclosure.

FIG. 5 is a block diagram of a storage system according to some embodiments of the present disclosure.

FIG. 7 is a circuit diagram for describing a power detection circuit of FIG. 6, according to some embodiments of the present disclosure.

FIG. 14 is a block diagram of a storage system according to some embodiments of the present disclosure.

US 12,573,437 B2

3

Figure 15:
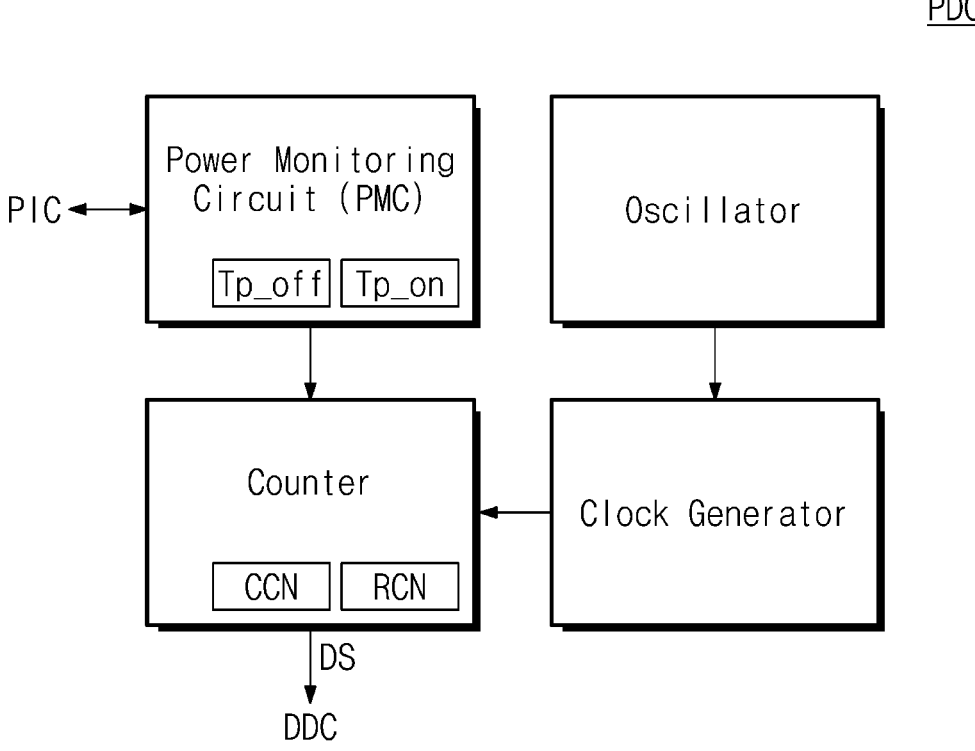

FIG. 15 is a block diagram for describing a power detection circuit of FIG. 14, according to some embodiments of the present disclosure.

Figure 16:
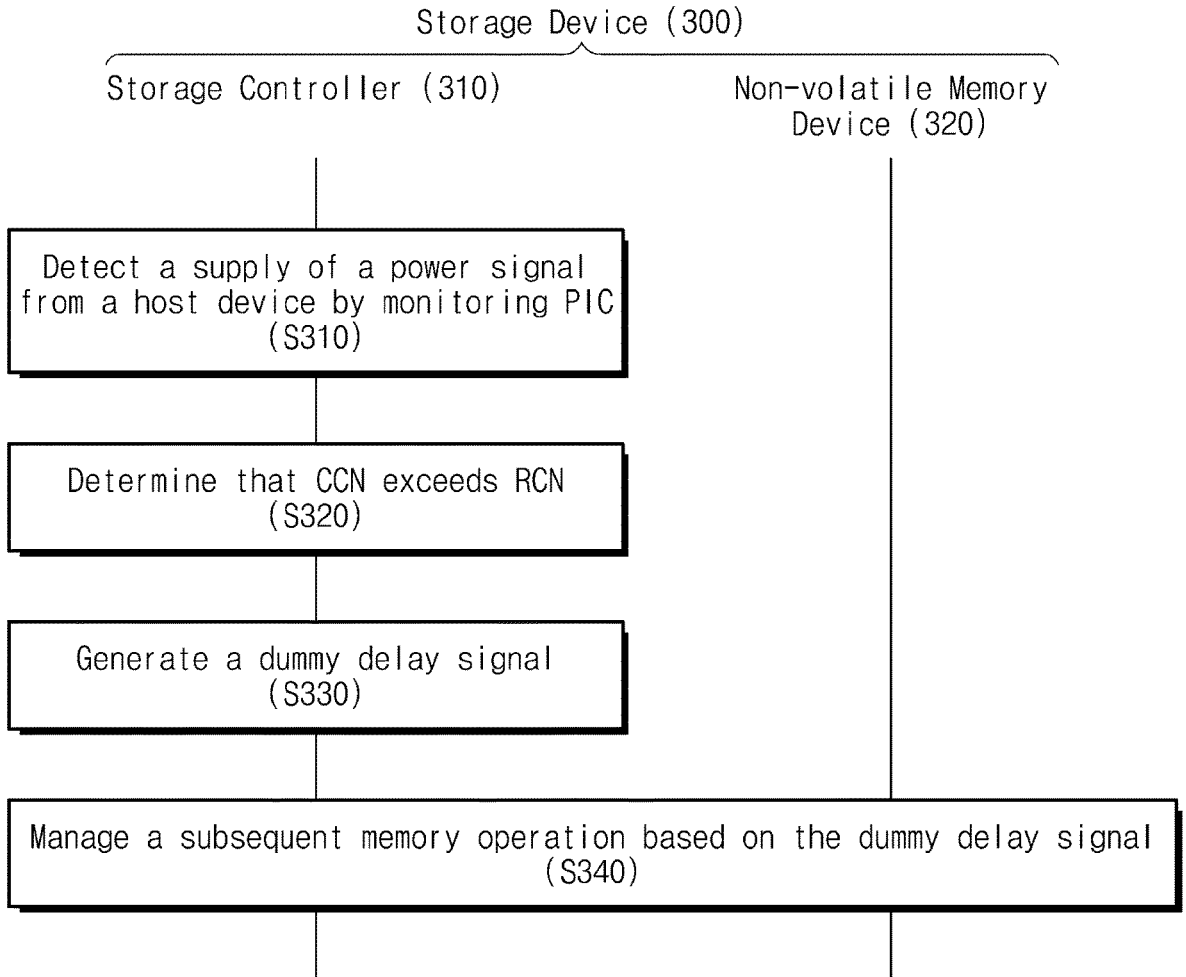

FIG. 16 is a flowchart for describing a method of operating a storage device according to some embodiments of the present disclosure.

DETAILED DESCRIPTION OF THE EMBODIMENTS

Figure 1:
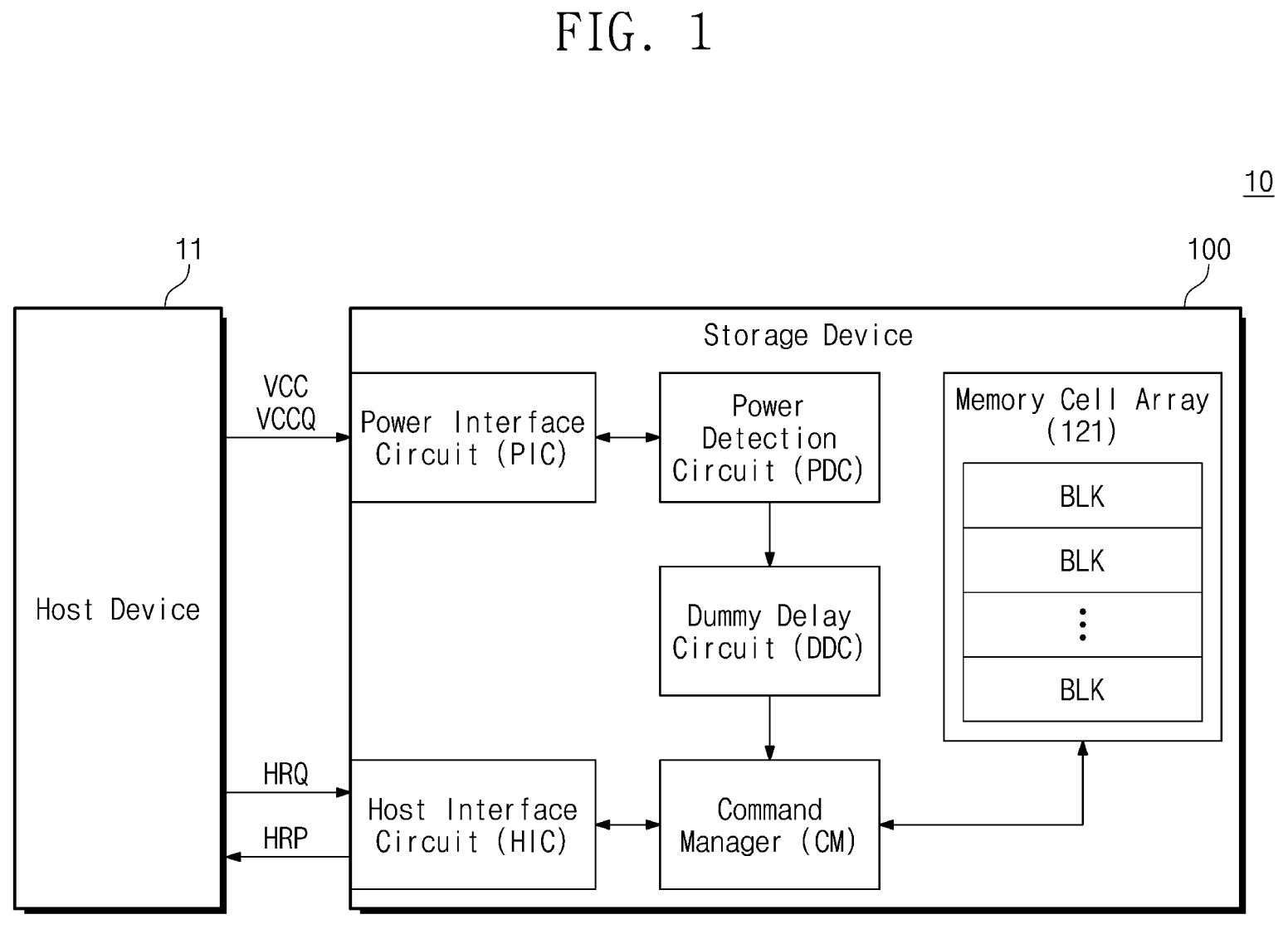

FIG. 1 is a block diagram of a storage system according to an embodiment of the present disclosure. Referring to FIG. 1, a storage system 10 may include a host device 11 and a storage device 100. In some embodiments, the storage system 10 may refer to a computing system, which is configured to process a variety of information, such as a personal computer (PC), a notebook, a laptop, a server, a workstation, a tablet PC, a smartphone, a digital camera, and a black box.

The host device 11 may control an overall operation of the storage system 10. The host device 11 may store data in the storage device 100 or may read data stored in the storage device 100.

For example, the host device 11 may provide a host request HRQ to the storage device 100. The host request HRQ may indicate an operation to be performed by the storage device 100, such as a read operation or a write operation. The host device 11 may receive a host response HRP from the storage device 100. The host response HRP may correspond to the host request HRQ. For example, the host response HRP may include data corresponding to the read operation, information indicating that the write operation is completely processed, etc.

In addition, the host device 11 may provide a power signal VCC and a power signal VCCQ to the storage device 100. The power signals VCC and VCCQ may provide driving voltages for the memory operation (e.g., a read operation, a write operation, or a reliability operation) of the storage device 100. For example, the power signals VCC and VCCQ may be direct current (DC) powers of different voltage levels. The voltage level of the power signal VCC may be higher than the voltage level of the power signal VCCQ.

The storage device 100 may communicate with the host device 11. The storage device 100 may include a host interface circuit HIC, a power interface circuit PIC, a power detection circuit PDC, a dummy delay circuit DDC, a command manager CM, and a memory cell array 121.

The host interface circuit HIC may communicate with the host device 11 and the command manager CM. Under control of the command manager CM, the host interface circuit HIC may receive the host request HRQ from the host device 11 and may provide the host response HRP to the host device 11.

In some embodiments, the host interface circuit HIC may be implemented based on at least one of various interfaces such as a serial ATA (SATA) interface, a peripheral component interconnect express (PCIe) interface, a serial attached small computer system interface (SCSI) (SAS), a nonvolatile memory express (NVMe) interface, and a universal flash storage (UFS) interface.

The power interface circuit PIC may receive the power signal VCC and the power signal VCCQ from the host device 11. The power interface circuit PIC may provide the power signal VCC and/or the power signal VCCQ to other components of the storage device 100.

The power detection circuit PDC may monitor the power interface circuit PIC. For example, the power detection circuit PDC may detect whether the power signal VCC and/or the power signal VCCQ from the host device 11 is supplied to the power interface circuit PIC. Since the power detection circuit PDC determines whether a time interval between a point in time when the detected power signal is supplied and a point in time when a power signal was previously blocked exceeds a reference time interval, the power detection circuit PDC may determine if a long power-off event is associated with the detected power signal. The power detection circuit PDC may notify the dummy delay circuit DDC if the long power-off event occurs.

The long power-off event may refer to a state where a power-off time of the storage device 100 is long. The reference time interval may refer to a time that is used as a criteria to determine the long power-off event. In the storage device 100, when a time interval between a point in time when the power is turned off and a point in time when the power is turned on again increases, a physical environment of the storage device 100 may sharply change immediately after the power is turned on again. This change in the physical environment may lead to reductions of performance such as reduced data reliability, or delays or failures in subsequent memory operations. The reduction of performance may be temporary and may diminish as time elapses from a point in time when the power is turned on again. Accordingly, when the long power-off event is detected, the storage device 100 may create a dummy delay such that a subsequent memory operation is delayed, and thus, the reduction of performance may be minimized.

The dummy delay circuit DDC may generate a dummy delay signal based on information of the long power-off event received from the power detection circuit PDC. For example, when the power detection circuit PDC notifies the dummy delay circuit DDC that the long power-off event is detected, the dummy delay circuit DDC may generate the dummy delay signal. When the power detection circuit PDC notifies the dummy delay circuit DDC that the long power-off event is not detected, the dummy delay circuit DDC may not generate the dummy delay signal.

The command manager CM may communicate with the host interface circuit HIC, the dummy delay circuit DDC, and the memory cell array 121. The command manager CM may generate a request for the memory operation based on the host request HRQ received from the host device 11 through the host interface circuit HIC or an operation algorithm of internal firmware. The command manager CM may process the memory operation based on communication with the memory cell array 121. After processing the memory operation, the command manager CM may provide the host response HRP to the host device 11 through the host interface circuit HIC.

The command manager CM may delay the memory operation based on the dummy delay signal from the dummy delay circuit DDC. For example, when the command manager CM receives the dummy delay signal from the dummy delay circuit DDC, the command manager CM may provide the memory cell array 121 with a request for a subsequent memory operation after a time interval corresponding to the delay passes. As another example, when the dummy delay signal is not received, the command manager CM may manage the subsequent memory operation (e.g., may provide the memory cell array 121 with the request for the subsequent memory operation without the delay), depending on a default operating policy.

The memory cell array 121 may include a plurality of memory blocks BLK. The plurality of memory blocks BLK may perform the memory operation under control of the command manager CM.

In some embodiments, the memory blocks BLK of the memory cell array 121 may be implemented with a non-volatile memory. For example, the memory blocks BLK of the memory cell array 121 may be implemented with a NAND flash memory. However, the present disclosure is not limited thereto. For example, the memory cell array 121 may be implemented with one of various storage devices, which are able to retain data stored therein even though a power is turned off. For example, the memory cell array 121 may be implemented with one of a phase-change random access memory (PRAM), a magnetic random access memory (MRAM), a resistive random access memory (RRAM), and a ferroelectric random access memory (FRAM).

FIG. 2 is a diagram for describing a method of operating a storage device of FIG. 1, according to some embodiments of the present disclosure. Referring to FIGS. 1 and 2, the storage device 100 may include the host interface circuit HIC, the power interface circuit PIC, the power detection circuit PDC, the dummy delay circuit DDC, the command manager CM, and the memory cell array 121. Below, a method of operating the storage device 100 will be described.

In a first operation ①, the power detection circuit PDC may monitor the power interface circuit PIC. The power detection circuit PDC may detect a supply of a power signal while monitoring the power interface circuit PIC. The power signal may be the power signal VCC or the power signal VCCQ received from the host device 11 by the power interface circuit PIC.

In a second operation ②, the power detection circuit PDC may determine whether a time interval TI between a point in time when the power signal is supplied (hereinafter referred to as a "supply of a power signal") and a point in time when the power signal was previously blocked (hereinafter referred to as a "previous shutoff of a power signal") exceeds a reference time interval RTI. For example, after the supply of the power signal is shut off, the storage device 100 may be again supplied with the power signal. In other words, power may be restored to storage device 100, after the supply of the power signal is discontinued. The time interval TI may indicate a length of a time during which the supply of the power signal is shut off. In other words, the time interval TI may correspond to how long the power signal was shut off. The reference time interval RTI may be used as a criteria to determine the long power-off event. The reference time interval RTI may be changed due to a variety of factors such as a type of a power signal, a design of the storage device 100, and a device characteristic of the storage device 100.

The power detection circuit PDC may notify the dummy delay circuit DDC whether the time interval TI exceeds the reference time interval RTI. For example, the power detection circuit PDC may provide the dummy delay circuit DDC with an electrical signal indicating whether the time interval TI exceeds the reference time interval RTI.

In a third operation ③, the dummy delay circuit DDC may generate the dummy delay signal based on the electrical signal received from the power detection circuit PDC. For example, when the dummy delay circuit DDC receives the electrical signal indicating that the time interval TI exceeds the reference time interval RTI from the power detection circuit PDC, the dummy delay circuit DDC may generate the dummy delay signal. As another example, when the dummy delay circuit DDC receives the electrical signal indicating that the time interval TI does not exceed the reference time interval RTI from the power detection circuit PDC (or when the dummy delay circuit DDC does not receive the electrical signal), the dummy delay circuit DDC may not generate the dummy delay signal.

In a fourth operation ④, the command manager CM may manage a subsequent memory operation based on the dummy delay signal provided from the dummy delay circuit DDC. For example, when the command manager CM receives the dummy delay signal, the command manager CM may delay a subsequent memory operation that corresponds to the host request HRQ received through the host interface circuit HIC. In addition, the command manager CM may delay a subsequent memory operation that is requested by the operation algorithm of the internal firmware of the storage device 100. As another example, when the command manager CM does not receive the dummy delay signal, the command manager CM may manage a subsequent memory operation depending on a default operating policy.

In some embodiments, the command manager CM may control a point in time when the dummy delay signal is to be applied, depending on a type of a subsequent memory operation. For example, when the type of the subsequent memory operation indicates an emergency, the command manager CM may process the subsequent memory operation and may then apply the dummy delay signal. The emergency type may be a type of a memory operation that requires fast processing. As another example, when the type of the subsequent memory operation is not the emergency type, the command manager CM may apply the dummy delay and may then process the subsequent memory operation. This will be described in detail with reference to FIG. 4.

Figure 3:
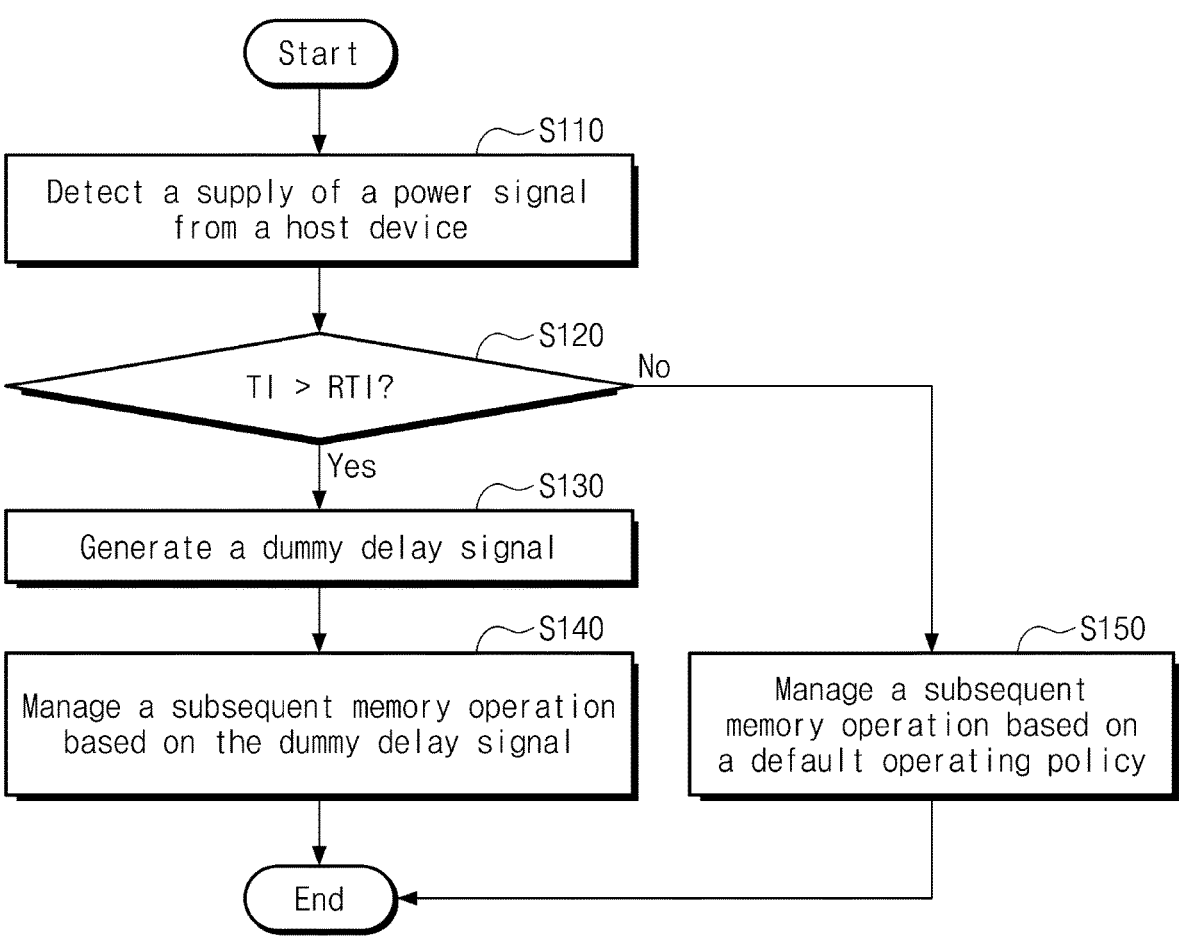
FIG. 3 is a flowchart for describing a method of operating a storage device according to some embodiments of the present disclosure.

FIG. 3 is a flowchart for describing a method of operating a storage device according to some embodiments of the present disclosure. A method of operating a storage device will be described with reference to FIG. 3. The storage device may correspond to the storage device 100 of FIGS. 1 and 2. The storage device may communicate with a host device.

In operation S110, the storage device may detect a supply of a power signal from the host device. The power signal may refer to a signal that is supplied again from the host device after the supply of the power signal is shut off. The power signal, if supplied, restores power to the storage device.

In operation S120, the storage device may determine whether the time interval TI exceeds the reference time interval RTI. The time interval TI may be from the previous shutoff of the power signal to the supply of the power signal in operation S110. The reference time interval RTI may refer to a time that is used as a criteria to determine the long power-off event. When it is determined that the time interval TI exceeds the reference time interval RTI, the storage device may perform operation S130.

In operation S130, the storage device may generate the dummy delay signal when the time interval TI exceeds the reference time interval RTI.

In operation S140, the storage device may manage a subsequent memory operation based on the dummy delay signal. The subsequent memory operation may indicate an operation to be performed in the storage device, such as a read operation, a write operation, or a reliability operation. The storage device may generate a delay based on the dummy delay signal and may process the subsequent memory operation after the time interval corresponding to the delay passes.

Returning to operation S120, when it is determined that the time interval TI does not exceed the reference time interval RTI, the storage device may perform operation S150.

In operation S150, the storage device may manage the subsequent memory operation based on the default operating policy. For example, the storage device may immediately process the subsequent memory operation without separately generating the delay.

Figure 4:
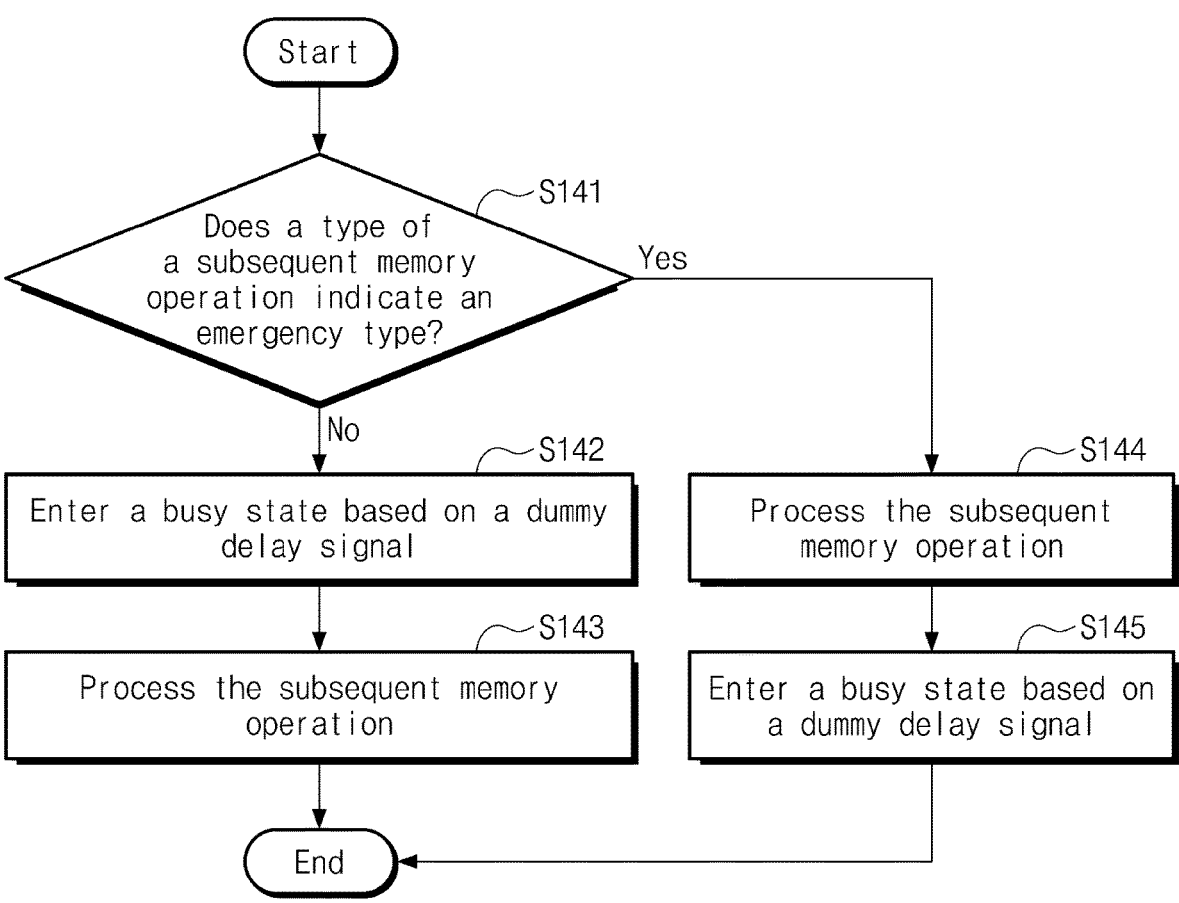
FIG. 4 is a flowchart for describing an example of the method of FIG. 3, according to some embodiments of the present disclosure.

FIG. 4 is a flowchart describing an example of the method of FIG. 3, according to some embodiments of the present disclosure. The method of operating the storage device will be described with reference to FIGS. 3 and 4. Operation S141, operation S142, operation S143, operation S144, and operation S145 of FIG. 4 may correspond to operation S140 of FIG. 3.

In operation S141, the storage device may determine whether a type of the subsequent memory operation is an emergency type. The type of the subsequent memory operation may be specified by the host device or may be specified based on the operation algorithm of the internal firmware of the storage device. When it is determined that the type of the subsequent memory operation is not the emergency type, the storage device may perform operation S142.

In operation S142, the storage device may enter a busy state based on the dummy delay signal. The dummy delay signal may be the dummy delay signal generated in operation S130. The busy state may indicate a state where it is impossible to process the memory operation. The storage device may enter the busy state and may switch to a ready state after a given time (e.g., the time interval corresponding to the delay) passes (e.g., after the busy state comes to an end). The ready state may indicate a state where it is possible to process the memory operation.

In operation S143, the storage device may process the subsequent memory operation. For example, after the busy state in operation S142 comes to an end and the storage device switches to the ready state, the storage device may process the subsequent memory operation. When the long power-off event is detected, the storage device may apply the dummy delay instead of immediately processing the memory operation. Therefore, the reduction of performance, which is due to a sharp change of a physical environment, such as a decrease in the reliability of data or a delay or failure of a subsequent memory operation, may be minimized.

Returning to operation S141, when it is determined that the type of the subsequent memory operation is the emergency type, the storage device may perform operation S144.

In operation S144, the storage device may process the subsequent memory operation. Because the type of the subsequent memory operation indicates the emergency type, even though the dummy delay is required, the storage device may preferentially process the subsequent memory operation. The memory operation of the emergency type may be a memory operation that has low importance of reliability, has a low probability that reliability is reduced, or requires urgent processing.

In operation S145, the storage device may process the subsequent memory operation and may then enter the busy state based on the dummy delay signal. While in the busy state, the storage device may fail to process another subsequent memory operation (e.g., any other memory operation except for the subsequent memory operation in operation S144). After the time interval corresponding to the delay passes from a point in time when the storage device enters the busy state, the storage device may switch to the ready state. After the storage device switches to the ready state, the storage device may process another subsequent memory operation.

Figure 5:
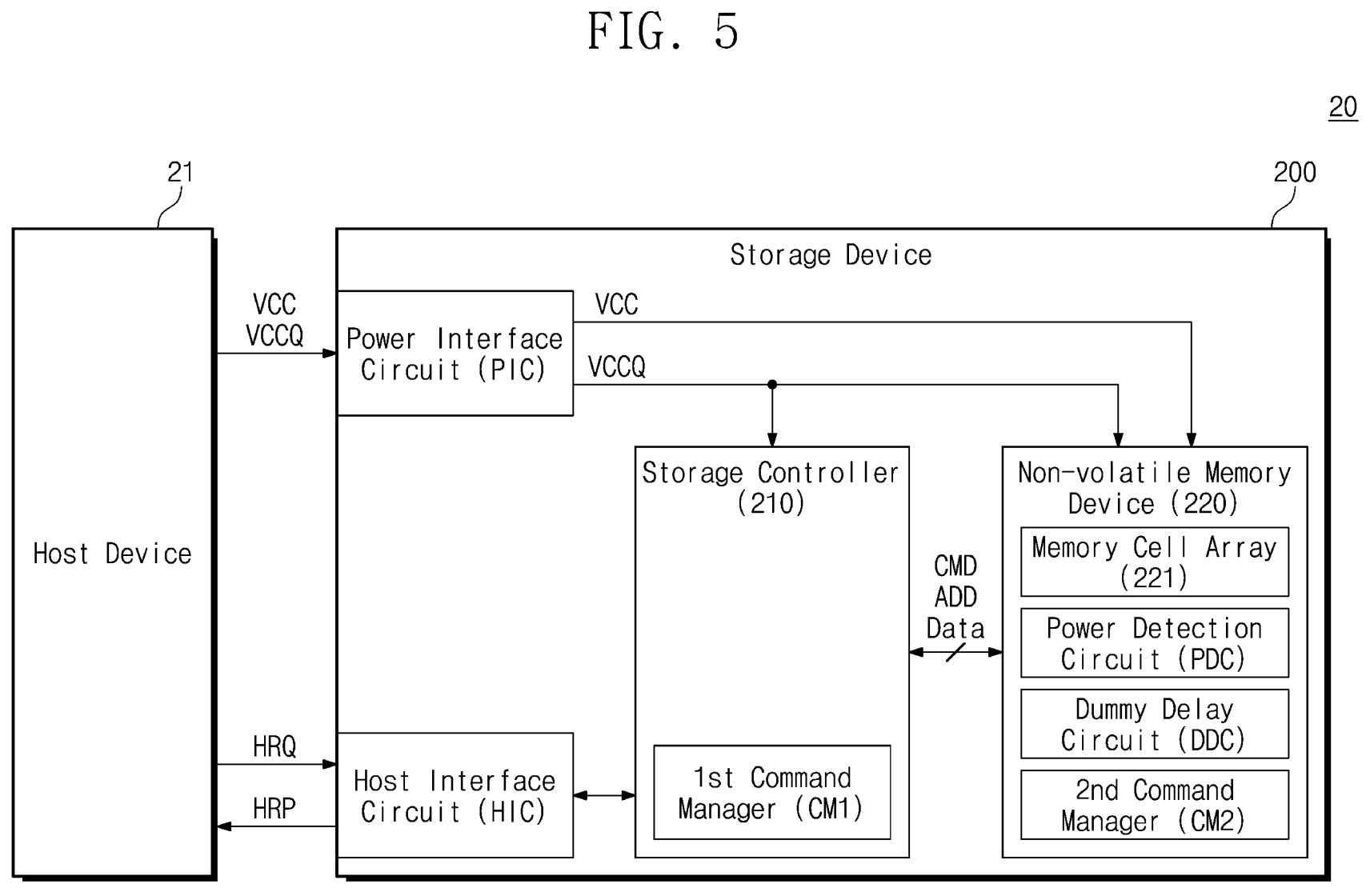

FIG. 5 is a block diagram of a storage system according to some embodiments of the present disclosure. Referring to FIG. 5, a storage system 20 may include a host device 21 and a storage device 200. The storage device 200 may include the host interface circuit HIC, the power interface circuit PIC, a storage controller 210, and a non-volatile memory device 220.

The host interface circuit HIC may communicate with the host device 21 and the storage controller 210. Under control of the storage controller 210, the host interface circuit HIC may receive the host request HRQ from the host device 21 and may provide the host response HRP to the host device 21.

The power interface circuit PIC may receive the power signals VCC and VCCQ from the host device 21. The power interface circuit PIC may provide the power signal VCCQ to the storage controller 210. The power interface circuit PIC may provide the power signals VCC and VCCQ to the non-volatile memory device 220.

The storage controller 210 may be driven by the power signal VCCQ. Under control of the host device 21, the storage controller 210 may store data in the non-volatile memory device 220 or may read data stored in the non-volatile memory device 220.

For example, the storage controller 210 may include a first command manager CM1. Based on the host request HRQ, the first command manager CM1 may store data in the non-volatile memory device 220 or may read data stored in the non-volatile memory device 220. The first command manager CM1 may be implemented with hardware, software, or a combination thereof. When the first command manager CM1 is implemented by software, the first command manager CM1 may be loaded to a volatile memory of the storage controller 210 in the form of an instruction. In this case, a processor of the storage controller 210 may implement functions of the first command manager CM1 by executing the loaded instructions.

The first command manager CM1 may provide a command CMD and an address ADD to the non-volatile memory device 220. The command CMD may indicate a memory operation to be performed by the non-volatile memory device 220. The address ADD may indicate a location of the non-volatile memory device 220, at which the memory operation is to be performed. The first command manager CM1 may exchange data with the non-volatile memory device 220. For example, the first command manager CM1 may provide data to the non-volatile memory device 220 in the write operation or may read data from the non-volatile memory device 220 in the read operation.

The first command manager CM1 may determine a subsequent memory operation based on the host request HRQ or the internal firmware algorithm of the storage device 200 and may provide a request indicating the subsequent memory operation to the non-volatile memory device 220. The request may include the command CMD and the address ADD. The request may selectively include data depending on a type of a command (e.g., the read operation or the write operation). The first command manager CM1 may receive a response corresponding to the request from the non-volatile memory device 220, may generate the host response HRP based on the response, and may provide the host response HRP to the host device 21 through the host interface circuit HIC.

The non-volatile memory device 220 may be driven by the power signals VCC and VCCQ. The non-volatile memory device 220 may perform the memory operation under control of the storage controller 210.

The non-volatile memory device 220 may include a memory cell array 221, the power detection circuit PDC, the dummy delay circuit DDC, and a second command manager CM2.

The memory cell array 221 may include a plurality of memory blocks. The plurality of memory blocks may store data.

The power detection circuit PDC may monitor the power signals VCC and VCCQ received from the power interface circuit PIC. The power detection circuit PDC may detect a supply of at least one of the power signals VCC and VCCQ. For example, the power detection circuit PDC may detect the supply of the power signal VCC, may detect the supply of the power signal VCCQ, or may detect both the power signal VCC and the power signal VCCQ. The power detection circuit PDC may provide the dummy delay circuit DDC with an electrical signal indicating whether the long power-off event occurs.

The dummy delay circuit DDC may generate the dummy delay signal based on the electrical signal received from the power detection circuit PDC. The dummy delay circuit DDC may provide the dummy delay signal to the first command manager CM1 or the second command manager CM2. An operation in which the second command manager CM2 processes the dummy delay signal will be described in detail with reference to FIG. 10. An operation in which the first command manager CM1 processes the dummy delay signal will be described in detail with reference to FIG. 11.

The second command manager CM2 may communicate with the first command manager CM1. The second command manager CM2 may process the memory operation based on a request received from the first command manager CM1.

Figure 6:
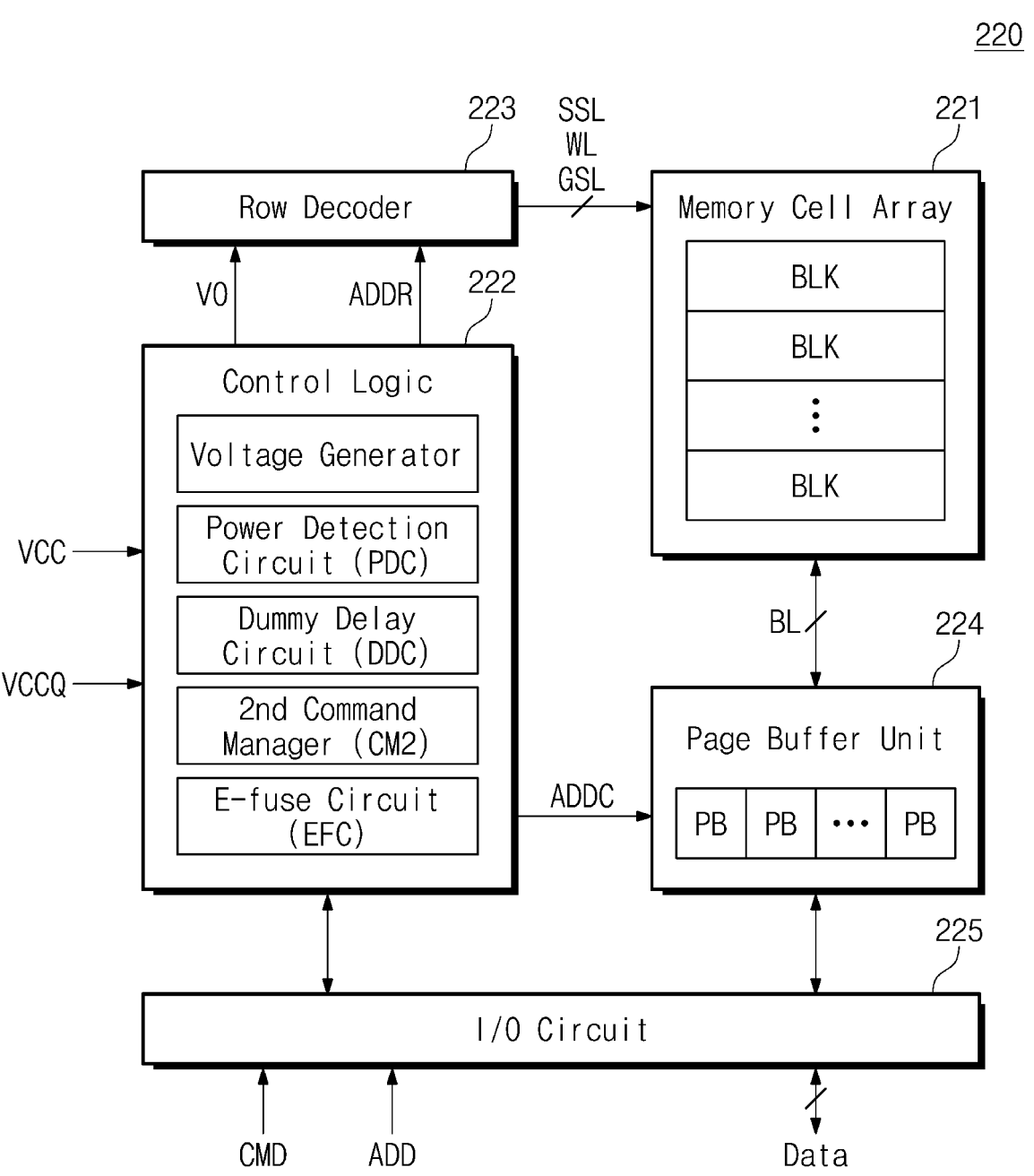
FIG. 6 is a block diagram illustrating a non-volatile memory device of FIG. 5, according to some embodiments of the present disclosure.

FIG. 6 is a block diagram illustrating a non-volatile memory device of FIG. 5, according to some embodiments of the present disclosure. Referring to FIGS. 5 and 6, the non-volatile memory device 220 may include the memory cell array 221, control logic 222, a row decoder 223, a page buffer unit 224, and an input/output (I/O) circuit 225.

The I/O circuit 225 may communicate with the storage controller 210, the control logic 222, and the page buffer unit 224. The I/O circuit 225 may receive the command CMD and the address ADD from the storage controller 210. The I/O circuit 225 may provide the command CMD and the address ADD to the control logic 222. The I/O circuit 225 may exchange data with the storage controller 210. When performing the write operation, the I/O circuit 225 may receive data from the storage controller 210 and may provide the data to the control logic 222. When performing the read operation, the I/O circuit 225 may receive data from the page buffer unit 224 and may provide the data to the storage controller 210.

The control logic 222 may receive the power signals VCC and VCCQ from the power interface circuit PIC. The control logic 222 may communicate with the I/O circuit 225. The control logic 222 may perform the memory operation. The control logic 222 may generate a row address ADDR and a column address ADDC based on the address ADD from the I/O circuit 225.

The control logic 222 may include a voltage generator, the power detection circuit PDC, the dummy delay circuit DDC, the second command manager CM2, and an E-fuse circuit EFC.

The voltage generator may generate an operating voltage VO corresponding to the memory operation under control of the second command manager CM2. The operating voltage VO may be provided to the row decoder 223 together with the row address ADDR. The operating voltage VO may be used in the memory operation such as a read operation or a write operation.

The power detection circuit PDC may detect at least one of the power signals VCC and VCCQ and may store an electrical signal, which indicates whether the long power-off event occurs with regard to the detected power signal, in the E-fuse circuit EFC.

The E-fuse circuit EFC may store the electrical signal received from the power detection circuit PDC.

The dummy delay circuit DDC may generate the dummy delay signal based on the electrical signal stored in the E-fuse circuit EFC. The dummy delay circuit DDC may provide the dummy delay signal to the second command manager CM2. Alternatively, the dummy delay circuit DDC may provide the dummy delay signal to the first command manager CM1 of the storage controller 210 through the I/O circuit 225.

The second command manager CM2 may process the memory operation based on the command CMD and the address ADD received through the I/O circuit 225.

The row decoder 223 may receive the operating voltage VO and the row address ADDR from the control logic 222. The row decoder 223 may be connected to the memory cell array 221 through string selection lines SSL, wordlines WL, and ground selection lines GSL. The row decoder 223 may decode the row address ADDR and may control voltages to be applied to the string selection lines SSL, the wordlines WL, and the ground selection lines GSL based on a result of the decoding and the operating voltage VO.

The memory cell array 221 may include the plurality of memory blocks BLK. Based on the voltage applied to the string selection lines SSL, the wordlines WL, and the ground selection lines GSL, the plurality of memory blocks BLK may store data or may provide data stored therein to the page buffer unit 224.

The page buffer unit 224 may include a plurality of page buffers PB. The page buffer unit 224 may be connected to the memory cell array 221 through bitlines BL. The page buffer unit 224 may read data from the memory cell array 221 by sensing voltages of the bitlines BL under control of the control logic 222. The page buffer unit 224 may receive the column address ADDC from the control logic 222, may decode the column address ADDC and, may provide the data read by the page buffer unit 224 to the I/O circuit 225 based on a result of the decoding. The I/O circuit 225 may provide the data received from the page buffer unit 224 to the storage controller 210.

Figure 7:
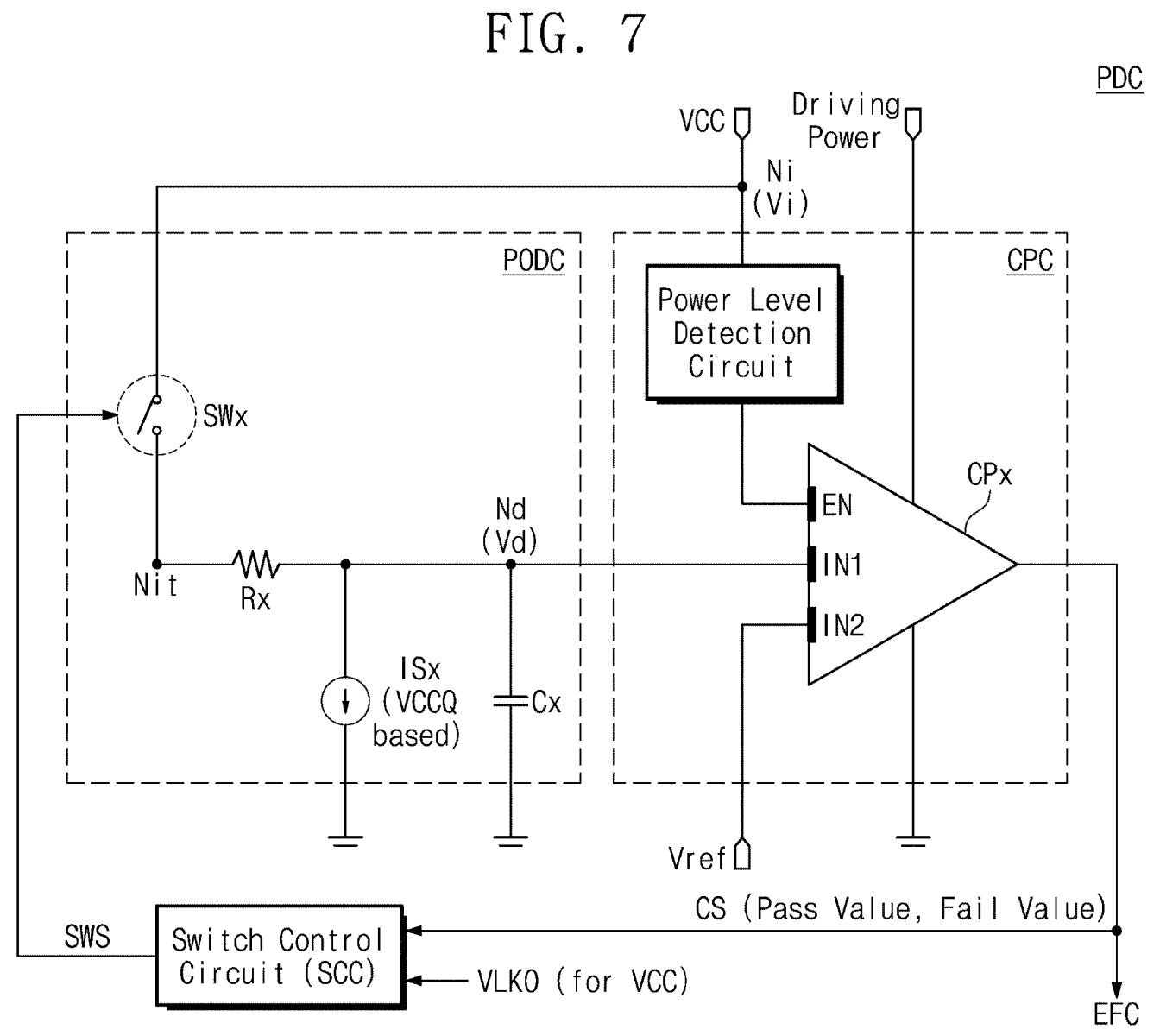

FIG. 7 is a circuit diagram for describing a power detection circuit of FIG. 6, according to some embodiments of the present disclosure. Referring to FIGS. 6 and 7, the power detection circuit PDC may receive the power signals VCC and VCCQ. The power detection circuit PDC may communicate with the E-fuse circuit EFC. The power detection circuit PDC may receive a lockout signal VLKO and a reference voltage level Vref from an external device. The lockout signal VLKO may be a signal indicating that the power signal VCC is shut off (or blocked). The reference voltage level Vref may be used to determine the long power-off event.

The power detection circuit PDC may include a power-off detection circuit PODC, a comparison circuit CPC, and a switch control circuit SCC.

The power-off detection circuit PODC may include a switch SWx, a resistor Rx, a current source ISx, and a capacitor Cx.

The switch SWx may be connected between an input node Ni and an internal node Nit. For example, the switch SWx may be directly connected to the input node Ni and the internal node Nit. The input node Ni may be a node for receiving the power signal VCC. The input node Ni may have an input voltage level Vi. The input voltage level Vi may increase or decrease depending on whether the power signal VCC is supplied. The switch SWx may be turned on or turned off based on a switch control signal SWS provided from the switch control circuit SCC.

The resistor Rx may be connected between the internal node Nit and a detection node Nd. The detection node Nd may have a detection voltage level Vd. The detection voltage level Vd may be used to determine the long power-off event.

The current source ISx may be connected to the detection node Nd. The current source ISx may be also connected to the resistor Rx. The current source ISx may be driven based on the power signal VCCQ. The current source ISx may linearly decrease the detection voltage level Vd of the detection node Nd. When the power signal VCCQ is blocked, the current source ISx may operate as an open circuit. In this case, the detection voltage level Vd may non-linearly increase or decrease by the resistor Rx and the capacitor Cx.

The capacitor Cx may be connected between the detection node Nd and a ground node. A voltage level across the capacitor Cx may be also referred to as the "detection voltage level Vd". The capacitor Cx may retain charges supplied from the power signal VCC through the resistor Rx and the switch SWx. The capacitor Cx may be implemented to have a size sufficient to retain charges (e.g., a size sufficient to maintain the saturated detection voltage level Vd of a point in time t3 of FIGS. 8 and 9).

In some embodiments, a charge amount of the capacitor Cx may indicate a length of a time during which the power signal VCC is blocked. In other words, the charge amount of the capacitor Cx may correspond to how long the power signal VCC was blocked. For example, when the power signal VCC is blocked and the power signal VCCQ is supplied, the capacitor Cx may be discharged linearly by the current source ISx. There may be a correlation between the decrement of the detection voltage level Vd and the length of the time during which the power signal VCC is blocked.

In some embodiments, the charge amount of the capacitor Cx may indicate the length of the time during which the power signal VCCQ is blocked. In other words, the charge amount of the capacitor Cx may correspond to how long the power signal VCCQ was blocked. For example, when the power signal VCCQ is blocked and the power signal VCC is supplied, the current source ISx may be deactivated, and a comparator CPx may operate as an open circuit. The capacitor Cx may be charged by the power signal VCC. There may be a correlation between the increment of the detection voltage level Vd and the length of the time during which the power signal VCCQ is blocked.

In some embodiments, the charge amount of the capacitor Cx may indicate the length of the time during which power signals VCC and VCCQ are blocked. In other words, the charge amount of the capacitor Cx may correspond to how long the power signals VCC and VCCQ were blocked. For example, when both the power signal VCC and the power signal VCCQ are blocked, the current source ISx may be deactivated, and the switch SWx and the comparator CPx may operate as an open circuit. The capacitor Cx and the resistor Rx may constitute an RC circuit. The capacitor Cx may be discharged non-linearly depending on a time constant value of the RC circuit. There may be a correlation between the non-linear decrement of the detection voltage level Vd and the length of the time during which the power signals VCC and VCCQ are blocked.

The comparison circuit CPC may include a power level detection circuit and the comparator CPx. The power level detection circuit may receive the power signal VCC through the input node Ni. The power level detection circuit may generate an enable signal in response to the power signal VCC.

The comparator CPx may be driven by a driving power. For example, the driving power may be the power signal VCC, the power signal VCCQ, or an internal power signal. The comparator CPx may include an enable terminal EN, a first input terminal IN1, a second input terminal IN2, and an output terminal. The enable terminal EN may be connected to the power level detection circuit. The first input terminal IN1 may be connected to the detection node Nd. The second input terminal IN2 may receive the reference voltage level Vref. The output terminal may be connected to the E-fuse circuit EFC and the switch control circuit SCC.

When the enable signal is received from the power level detection circuit through the enable terminal EN, the comparator CPx may be activated. The comparator CPx thus activated may compare the detection voltage level Vd of the first input terminal IN1 and the reference voltage level Vref of the second input terminal IN2. The comparator CPx thus activated may generate a comparison signal CS based on the comparison operation. The comparator CPx thus activated may provide the comparison signal CS to the E-fuse circuit EFC and the switch control circuit SCC.

For example, when the power detection circuit PDC detects a shutoff-supply event of the power signal VCC (e.g., an event when the power signal VCC is shut off and then supplied again), the comparator CPx thus activated may generate the comparison signal CS having a first logical value, when the detection voltage level Vd is not higher than the reference voltage level Vref. For example, the comparator CPx may generate the comparison signal CS with the first logical value when the long power-off event is detected. The first logical value may be also referred to as a "fail value". The comparison signal CS may be the electrical signal indicating whether the long power-off event occurs with regard to the supplied power signal.

As in the above description, the comparator CPx thus activated may generate the comparison signal CS having a second logical value, when the detection voltage level Vd is higher than the reference voltage level Vref. For example, the comparator CPx may generate the comparison signal CS with the first logical value when the long power-off event does not occur. The second logical value may be also referred to as a "pass value".

In contrast, when the comparator CPx is not activated (e.g., when the comparator CPx does not receive the enable signal from the power level detection circuit), the comparator CPx may not generate the comparison signal CS.

Although the case where the shutoff-supply event of the power signal VCC is detected has been described in detail, it is to be understood that the way to perform the comparison operation may be changed due to various factors such as a type of a power signal to be detected, a circuit design, and a device characteristic, or the reference voltage level Vref may be changed.

The switch control circuit SCC may receive the comparison signal CS from the comparator CPx. Regardless of whether the comparison signal CS has the first logical value or the second logical value, the switch control circuit SCC may turn on the switch SWx with the switch control signal SWS in response to receiving the comparison signal CS. The switch SWx thus turned on may operate as a short circuit.

The switch control circuit SCC may receive the lockout signal VLKO from an external circuit. The switch control circuit SCC may turn off the switch SWx with the switch control signal SWS in response to receiving the lockout signal VLKO. The switch SWx thus turned off may operate as an open circuit.

The structure of the power detection circuit PDC in the non-volatile memory device 220 is described as an example with reference to FIGS. 6 and 7. An operation in which the power detection circuit PDC detects a power signal and waveforms of signals will be described in detail with reference to FIGS. 8 and 9.

Figure 8:
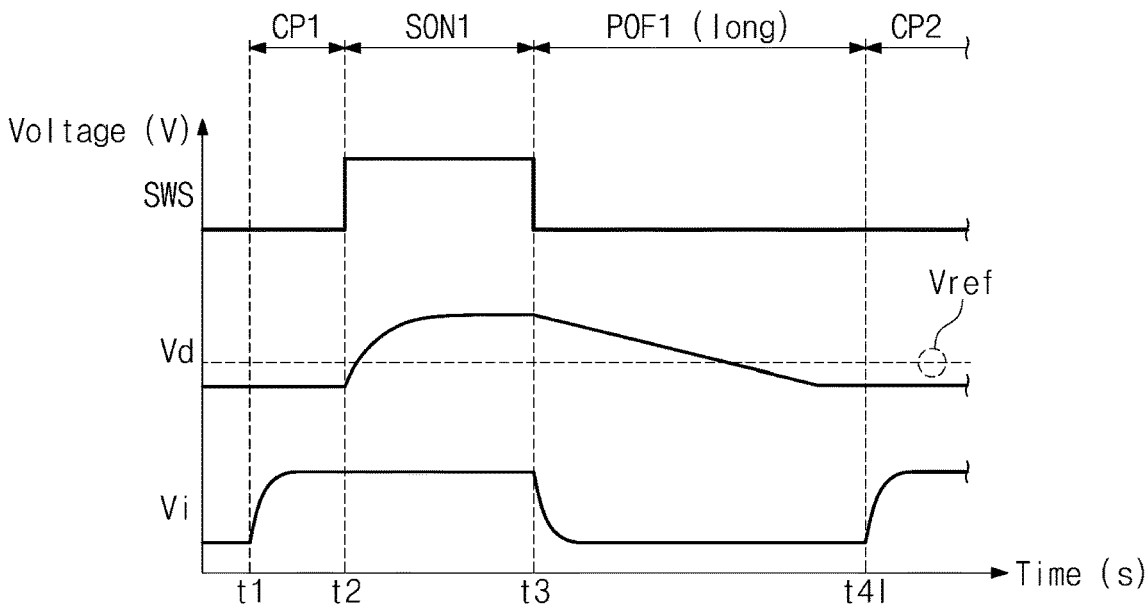
FIG. 8 is a graph for describing signals of FIG. 7, according to some embodiments of the present disclosure.

FIG. 8 is a graph for describing signals of FIG. 7, according to some embodiments of the present disclosure. How waveforms of the switch control signal SWS, the detection voltage level Vd, and the input voltage level Vi change over time will be described with reference to FIGS. 7 and 8. In FIG. 8, a horizontal axis represents a time, and a vertical axis represents a voltage.

In an initial time interval before a point in time t1, the supply of the power signal VCC may be blocked, and the power signal VCCQ may be supplied. The switch control signal SWS may have the low level. The switch control signal SWS of the low level may turn off the switch SWx. The detection voltage level Vd may be discharged by the current source ISx, and thus, may correspond to a low voltage level. Because the power signal VCC is not supplied to the input node Ni, the input voltage level Vi may correspond to the low voltage level.

A time interval from t1 to t2 may be referred to as a "first comparison period CP1". In the first comparison period CP1, the supply of the power signal VCC may be detected, and the comparator CPx may perform the comparison operation. As the power signal VCC is supplied to the input node Ni, the input voltage level Vi may increase. After completing the comparison operation, the comparator CPx may generate the comparison signal CS.

A time interval from t2 to t3 may be referred to as a "first switch-on period SON1". In the first switch-on period SON1, the switch SWx may maintain the turn-on state, and the power signal VCC may be continuously supplied. The switch control circuit SCC may generate the switch control circuit SWS having the high level in response to the comparison signal CS. The turned-on switch SWx may connect the input node Ni and the internal node Nit. The detection voltage level Vd may increase non-linearly based on the input voltage level Vi received through the turned-on switch SWx and the time constant value of the resistor Rx and the capacitor Cx.

A time interval from t3 to t41 may be referred to as a "first power-off period POF1". In the first power-off period POF1, the power signal VCC may be shut off. The switch control circuit SCC may generate the switch control signal SWS having the low level in response to the lockout signal VLKO indicating the shutoff of the power signal VCC. The turned-off switch SWx may disconnect the input node Ni from the internal node Nit. The detection voltage level Vd may decrease linearly (e.g., uniformly over time) by the current source ISx. The input voltage level Vi may decrease as the power signal VCC is shut off.

The first power-off period POF1 may be a time interval long enough to be determined as a long power-off event. Whether the first power-off period POF1 is sufficiently long may be determined based on the decrement of the detection voltage level Vd. For example, at the point in time t41, the detection voltage level Vd may be lower than the reference voltage level Vref. Accordingly, the first power-off period POF1 may be determined as a time interval where the long power-off event occurs.

From after the point in time t41, a series of operations (e.g., comparison, switch-on, and switch-off operations) may be sequentially repeated. After the point in time t41, a second comparison period CP2 may exist. In the second comparison period CP2, the supply of the power signal VCC may be detected, and the comparator CPx may perform the comparison operation. In this case, because the detection voltage level Vd is lower than the reference voltage level Vref, the comparator CPx may generate the comparison signal CS having the first logical value (e.g., the fail value) indicating the long power-off event. The comparison signal CS having the first logical value may be used to generate the dummy delay signal.

Figure 9:
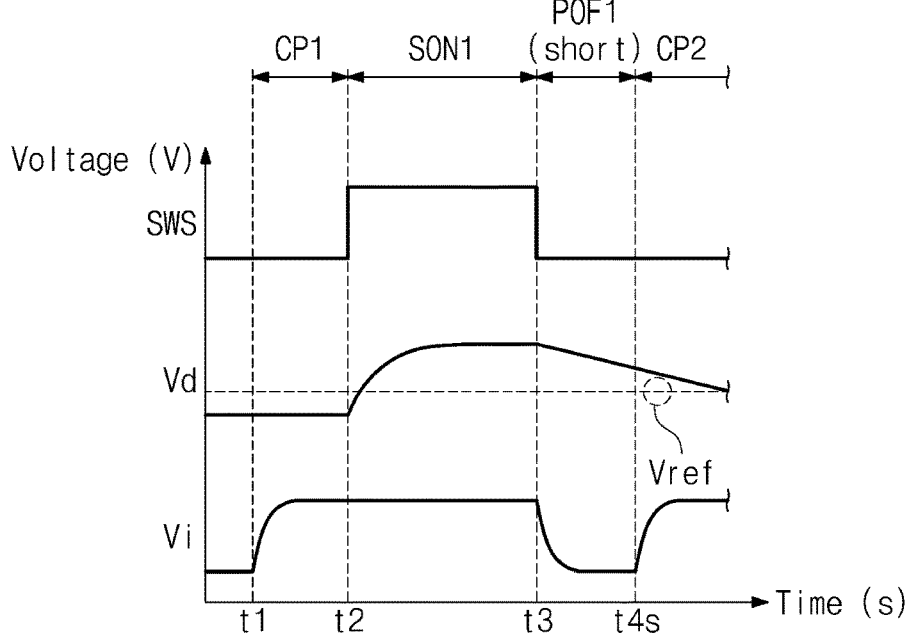
FIG. 9 is a graph for describing signals of FIG. 7, according to some embodiments of the present disclosure.

FIG. 9 is a graph for describing signals of FIG. 7, according to some embodiments of the present disclosure. How waveforms of the switch control signal SWS, the detection voltage level Vd, and the input voltage level Vi change over time will be described with reference to FIGS. 7 and 9. In FIG. 9, a horizontal axis represents a time, and a vertical axis represents a voltage.

A time interval before a point in time t1 may be referred to as an "initial time interval". A time interval from t1 to t2 may be referred to as a "first comparison period CP1". A time interval from t2 to t3 may be referred to as a "first switch-on period SON1". The initial time interval, the first comparison period CP1, and the first switch-on period SON1 are similar to the initial time interval, the first comparison period CP1, and the first switch-on period SON1 of FIG. 8, and thus, an additional description will be omitted to avoid redundancy.

A time interval from t3 to t4s may be referred to as a "first power-off period POF1". In the first power-off period POF1, the power signal VCC may be shut off. The switch control circuit SCC may generate the switch control signal SWS having the low level in response to the lockout signal VLKO indicating the shutoff of the power signal VCC. The turned-off switch SWx may disconnect the input node Ni from the internal node Nit. The detection voltage level Vd may decrease linearly (e.g., uniformly over time) by the current source ISx. The input voltage level Vi may decrease as the power signal VCC is shut off.

The first power-off period POF1 may be a time interval short enough not to be determined as a long power-off event. Whether the first power-off period POF1 is sufficiently long may be determined based on the decrement of the detection voltage level Vd. For example, at the point in time t4s, the detection voltage level Vd may be higher than the reference voltage level Vref. Accordingly, the first power-off period POF1 may be determined as a time interval where the long power-off event does not occur (e.g., a short power-off event occurs).

From after the point in time t4s, a series of operations (e.g., comparison, switch-on, and switch-off operations) may be sequentially repeated. After the point in time t4s, a second comparison period CP2 may exist. In the second comparison period CP2, the supply of the power signal VCC may be detected, and the comparator CPx may perform the comparison operation. In this case, because the detection voltage level Vd is higher than the reference voltage level Vref, the comparator CPx may generate the comparison signal CS having the second logical value (e.g., the pass value) indicating that the long power-off event does not occur. The comparison signal CS having the second logical value may not be used to generate the dummy delay signal.

Figure 10:
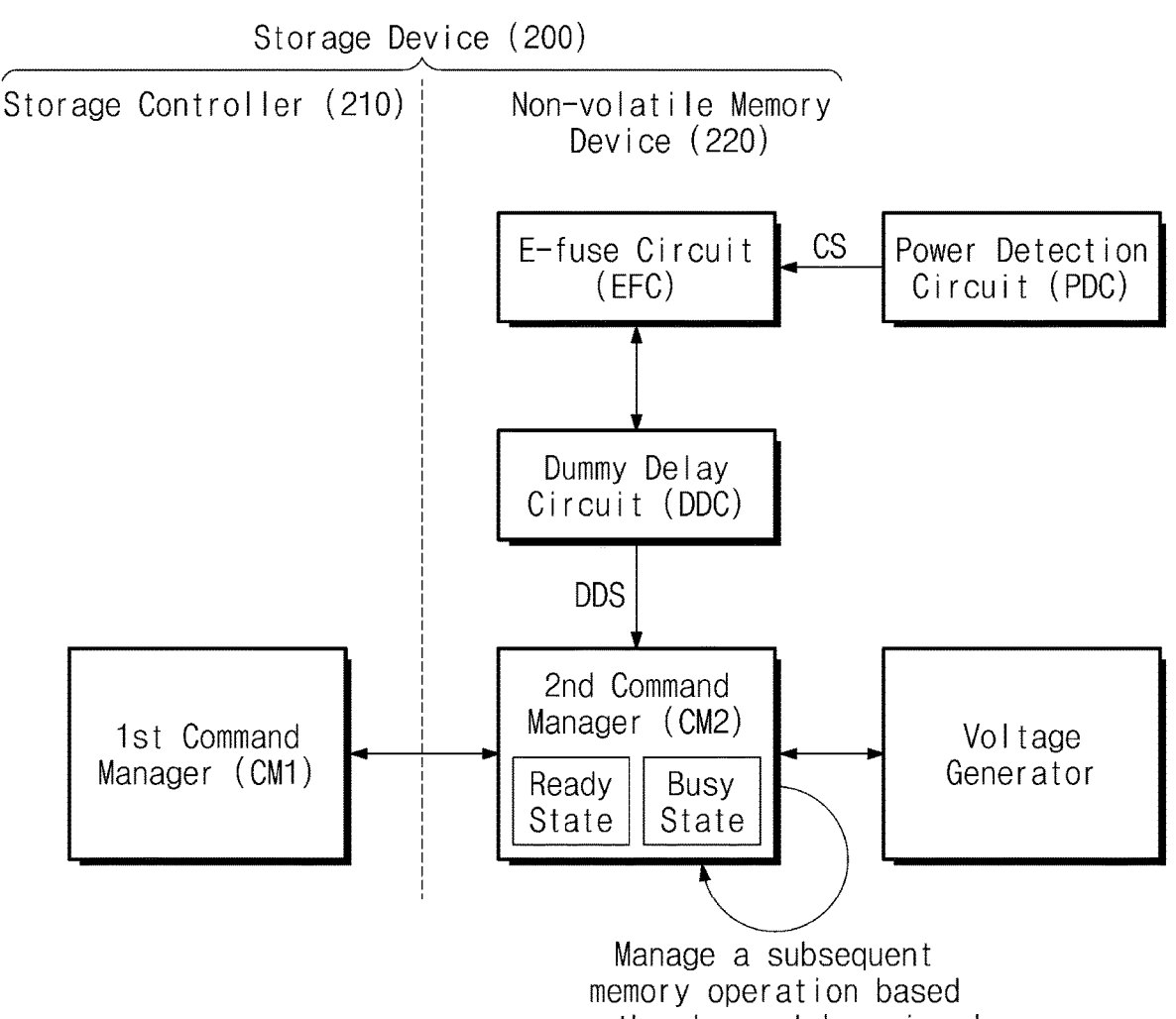
FIG. 10 is a block diagram for describing a storage device of FIG. 5, according to some embodiments of the present disclosure.

FIG. 10 is a block diagram for describing a storage device of FIG. 5, according to some embodiments of the present disclosure. Referring to FIGS. 5 and 10, the storage device 200 may include the storage controller 210 and the non-volatile memory device 220. The storage controller 210 may include the first command manager CM1. The non-volatile memory device 220 may include the power detection circuit PDC, the E-fuse circuit EFC, the dummy delay circuit DDC, the second command manager CM2, and the voltage generator.

The power detection circuit PDC may detect a supply of a power signal. The power detection circuit PDC may generate the comparison signal CS indicating whether the time interval between the supply of the power signal and the previous shutoff of the power signal is greater than the reference time interval.

For example, the power detection circuit PDC may generate the comparison signal CS based on a comparison operation of a detection voltage level of a detection node and a reference voltage level. When the detection voltage level is not higher than the reference voltage level (e.g., when the long power-off event is detected), the comparison signal CS may have the first logical value. When the detection voltage level is higher than the reference voltage level (e.g., when the long power-off event is not detected), the comparison signal CS may have the second logical value. The comparison signal CS may be an electrical signal indicating whether the long power-off event occurs with regard to the supplied power signal.

The E-fuse circuit EFC may store the comparison signal CS received from the power detection circuit PDC.

The dummy delay circuit DDC may read the comparison signal CS stored in the E-fuse circuit EFC. The dummy delay circuit DDC may generate a dummy delay signal DDS based on the comparison signal CS. For example, when the comparison signal CS has the first logical value, the dummy delay circuit DDC may generate the dummy delay signal DDS. The dummy delay circuit DDC may provide the dummy delay signal DDS to the second command manager CM2. As another example, when the comparison signal CS has the second logical value, the dummy delay circuit DDC may not generate the dummy delay signal DDS.

The second command manager CM2 may receive the dummy delay signal DDS from the dummy delay circuit DDC. When the second command manager CM2 receives the dummy delay signal DDS the long power-off event associated with the power signal is detected by the power detection circuit PDC. The second command manager CM2 may manage a subsequent memory operation based on the dummy delay signal DDS.

For example, the second command manager CM2 may receive a request for the subsequent memory operation from the first command manager CM1 in the storage controller 210. The second command manager CM2 may switch from the ready state to the busy state based on the dummy delay signal DDS. In the ready state, the second command manager CM2 may process the subsequent memory operation. In the busy state, the second command manager CM2 may be incapable of processing the subsequent memory operation. In other words, the second command manager CM2 may not process the subsequent memory operation in the busy state. When the time interval corresponding to the delay passes from a point in time when the switch to the busy state is made, the second command manager CM2 may switch to the ready state. The second command manager CM2 that switches to the ready state may process the subsequent memory operation by controlling an operating voltage to be generated by the voltage generator.

In some embodiments, the second command manager CM2 may manage the ready state and the busy state depending on a type of the subsequent memory operation. For example, the second command manager CM2 may determine whether the type of the subsequent memory operation is an emergency type. When the type of the subsequent memory operation is the emergency type, the second command manager CM2 may maintain the ready state, may process the subsequent memory operation, and may then enter the busy state. When the type of the subsequent memory operation is not the emergency type, the second command manager CM2 may enter the busy state, may switch to the ready state after the time interval corresponding to the delay passes (e.g., after the busy state comes to an end), and may then process the subsequent memory operation.

Figure 11:
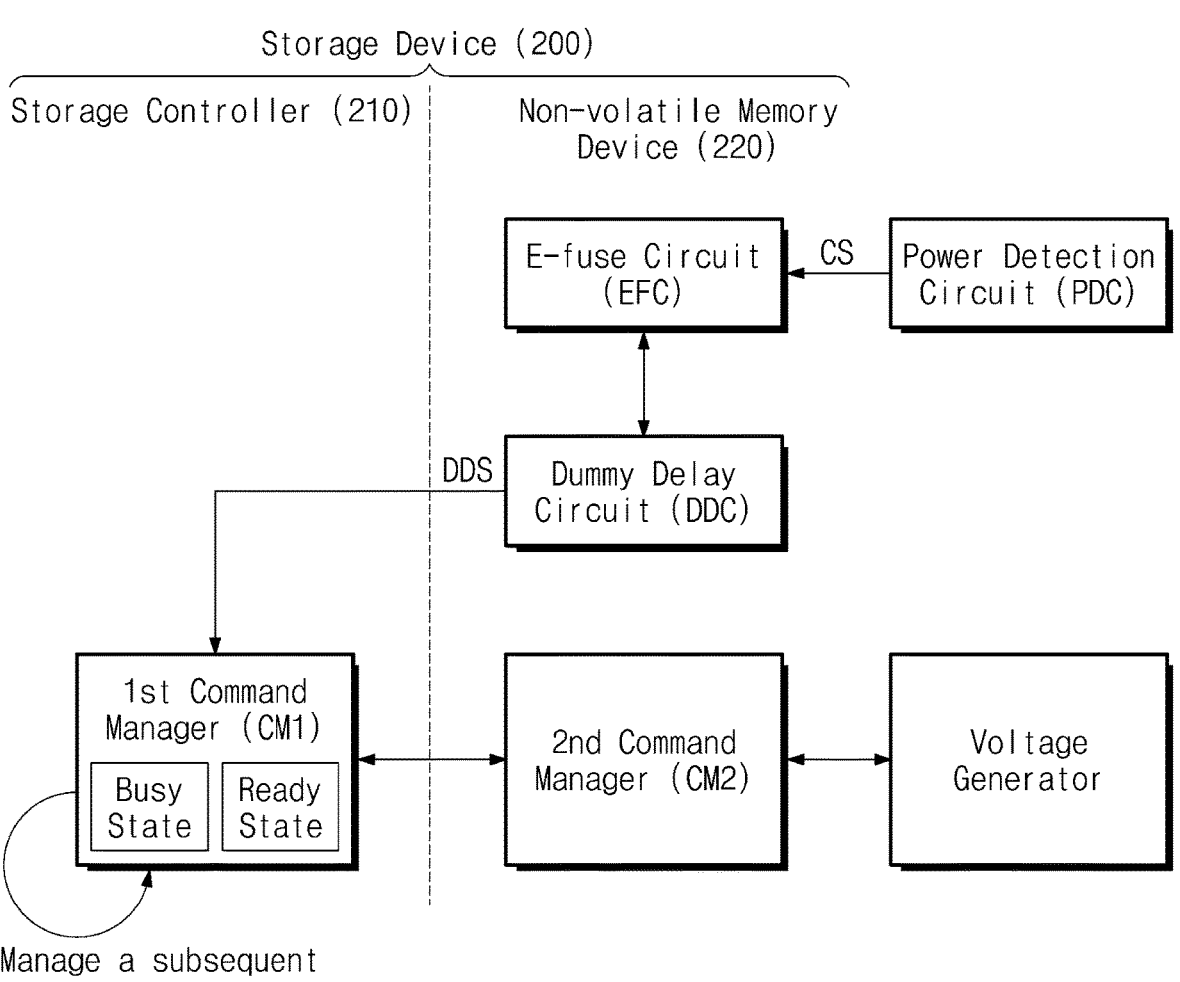
FIG. 11 is a block diagram for describing a storage device of FIG. 5, according to some embodiments of the present disclosure.

FIG. 11 is a block diagram for describing a storage device of FIG. 5, according to some embodiments of the present disclosure. Referring to FIGS. 5 and 11, the storage device 200 may include the storage controller 210 and the non-volatile memory device 220. The storage controller 210 may include the first command manager CM1. The non-volatile memory device 220 may include the power detection circuit PDC, the E-fuse circuit EFC, the dummy delay circuit DDC, the second command manager CM2, and the voltage generator.

The power detection circuit PDC may detect a supply of a power signal. The power detection circuit PDC may generate the comparison signal CS indicating whether the time interval between the supply of the power signal and the previous shutoff of the power signal is greater than the reference time interval. When the detection voltage level is not higher than the reference voltage level, the comparison signal CS may have the first logical value. When the detection voltage level is higher than the reference voltage level, the comparison signal CS may have the second logical value.

The E-fuse circuit EFC may store the comparison signal CS received from the power detection circuit PDC.

The dummy delay circuit DDC may read the comparison signal CS stored in the E-fuse circuit EFC. The dummy delay circuit DDC may generate the dummy delay signal DDS based on the comparison signal CS. For example, when the comparison signal CS has the first logical value, the dummy delay circuit DDC may generate the dummy delay signal DDS. The dummy delay circuit DDC may provide the dummy delay signal DDS to the first command manager CM1. As another example, when the comparison signal CS has the second logical value, the dummy delay circuit DDC may not generate the dummy delay signal DDS. Consequently, the dummy delay circuit DDC may not provide the dummy delay signal DDS to the first command manager CM1.

The first command manager CM1 may receive the dummy delay signal DDS from the dummy delay circuit DDC. When the first command manager CM1 receives the dummy delay signal DDS the long power-off event associated with the power signal is detected by the power detection circuit PDC. The first command manager CM1 may manage a subsequent memory operation based on the dummy delay signal DDS.

For example, the first command manager CM1 may switch from the ready state to the busy state based on the dummy delay signal DDS. In the ready state, the first command manager CM1 may provide a request for the subsequent memory operation to the second command manager CM2. In the busy state, the first command manager CM1 may not provide the request for the subsequent memory operation to the second command manager CM2. When the time interval corresponding to the delay passes from a point in time when the switch to the busy state is made, the first command manager CM1 may switch to the ready state. The first command manager CM1 that switches to the ready state may provide the request for the subsequent memory operation to the second command manager CM2 in the non-volatile memory device 220. The second command manager CM2 may process the memory operation by controlling an operating voltage to be generated by the voltage generator, based on the request received from the first command manager CM1.

In some embodiments, the first command manager CM1 may manage the ready state and the busy state depending on a type of the subsequent memory operation. For example, the first command manager CM1 may determine whether the type of the subsequent memory operation is an emergency type. When the type of the subsequent memory operation is the emergency type, the first command manager CM1 may maintain the ready state, may provide the request for the subsequent memory operation to the second command manager CM2, and may then enter the busy state. When the type of the subsequent memory operation is not the emergency type, the first command manager CM1 may enter the busy state, may switch to the ready state after the time interval corresponding to the delay passes (e.g., after the busy state comes to an end), and may then provide the second command manager CM2 with the request for the subsequent memory operation.

Figure 12:
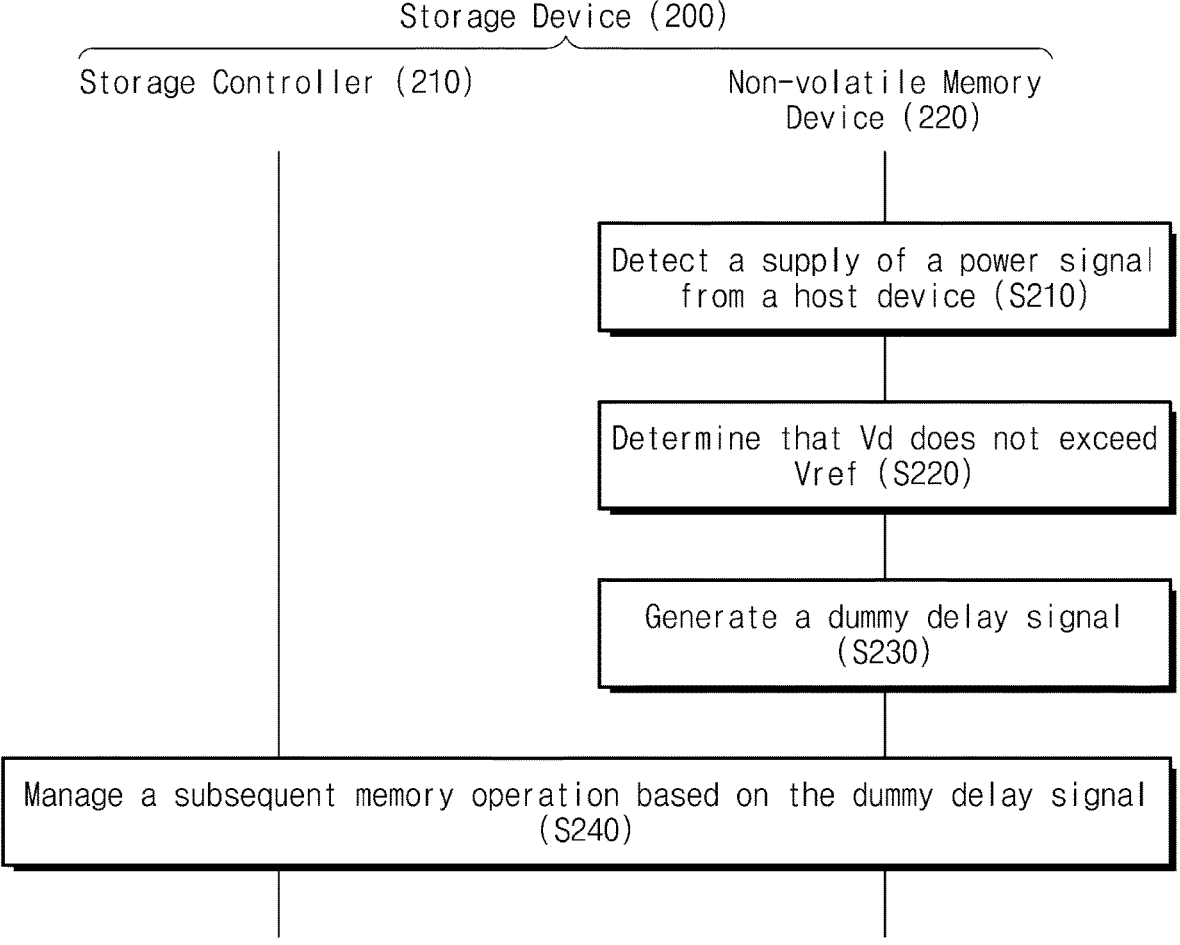
FIG. 12 is a flowchart for describing a method of operating a storage device according to some embodiments of the present disclosure.

FIG. 12 is a flowchart for describing a method of operating a storage device according to some embodiments of the present disclosure. Referring to FIG. 12, the storage device 200 may communicate with a host device. The storage device 200 may include the storage controller 210 and the non-volatile memory device 220. The storage controller 210 and the non-volatile memory device 220 may respectively correspond to the storage controller 210 and the non-volatile memory device 220 of FIG. 5.

In operation S210, the non-volatile memory device 220 may detect a supply of a power signal from a host device. For example, the storage device 200 may include a power interface circuit that receives the power signal from the host device. The non-volatile memory device 220 may detect the supply of the power signal based on whether the power signal is received by the power interface circuit.

In operation S220, the non-volatile memory device may determine that the detection voltage level Vd does not exceed the reference voltage level Vref. When the detection voltage level Vd does not exceed the reference voltage level Vref may indicate that the long power-off event occurs with regard to the power signal. However, the present disclosure is not limited thereto. For example, depending on a type of a power signal to be detected, a circuit design change, etc., when the detection voltage level Vd exceeds the reference voltage level Vref may indicate that the long power-off event occurs with regard to the power signal.

In operation S230, the non-volatile memory device 220 may generate a dummy delay signal. The dummy delay signal may be used to delay a subsequent memory operation as much as the time interval corresponding to the delay when the long power-off event is detected.

In operation S240, the storage device 200 may manage the subsequent memory operation based on the dummy delay signal. A device that manages the dummy delay signal may be the storage controller 210 or the non-volatile memory device 220. Depending on whether a type of the subsequent memory operation is an emergency type, the storage device 200 may process the subsequent memory operation after applying the delay or may apply the delay after processing the subsequent memory operation.

Figure 13:
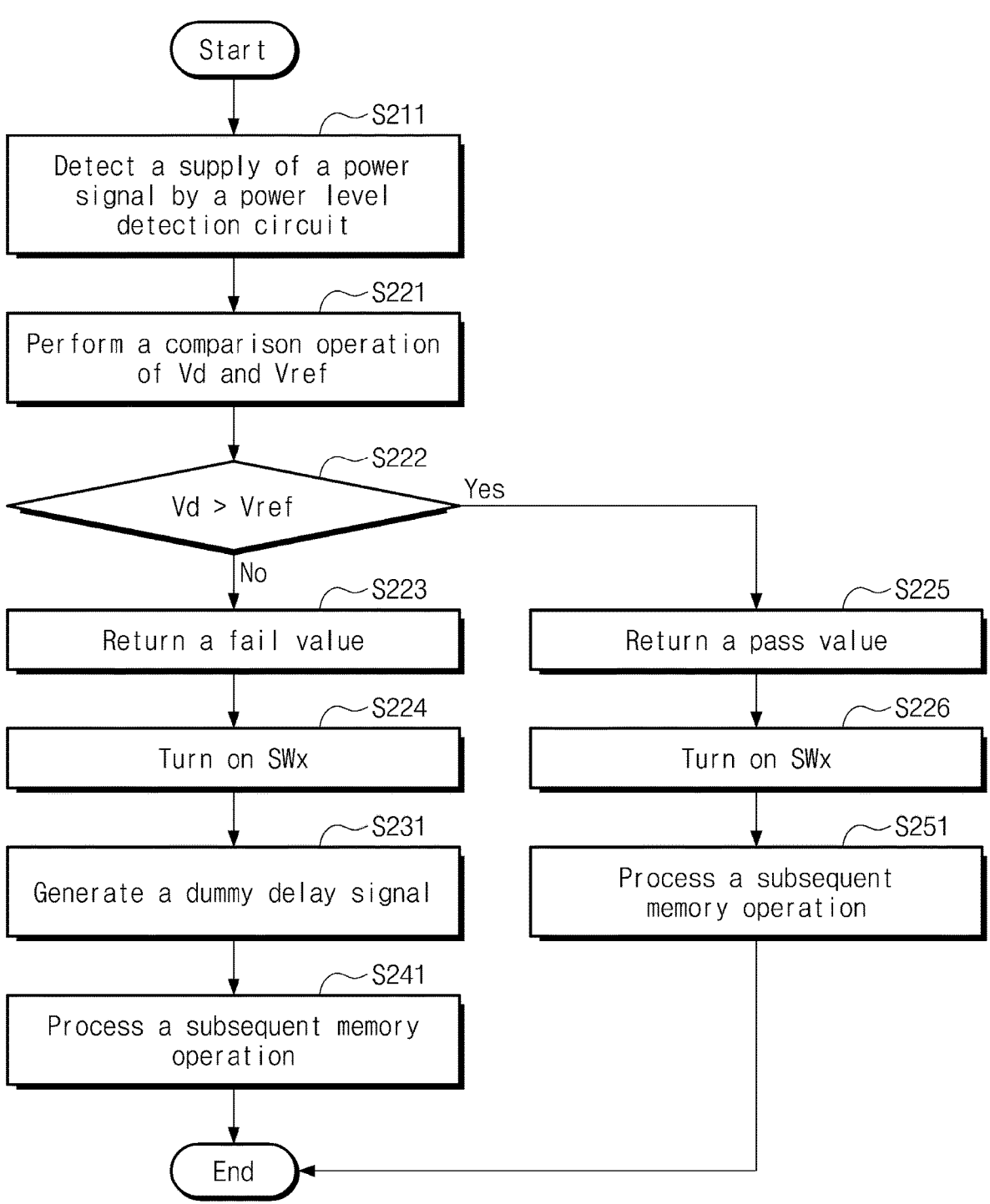
FIG. 13 is a flowchart for describing an example of the method of FIG. 12, according to some embodiments of the present disclosure.

FIG. 13 is a flowchart for describing an example of the method of FIG. 12, according to some embodiments of the present disclosure. The method of operating the storage device 200 will be described with reference to FIGS. 12 and 13. Operation S211 of FIG. 13 may correspond to operation S210 of FIG. 12. Operation S221, operation S222, operation S223, operation S224, operation S225, and operation S226 of FIG. 13 may correspond to operation S220 of FIG. 12. Operation S231 of FIG. 13 may correspond to operation S230 of FIG. 12. Operation S241 of FIG. 13 may correspond to operation S240 of FIG. 12.

In operation S211, the non-volatile memory device 220 of the storage device 200 may detect a supply of a power signal by using a power level detection circuit. The non-volatile memory device 220 may activate a comparator in response to detecting the supply of the power signal.

In operation S221, the activated comparator of the non-volatile memory device 220 may perform a comparison operation of the detection voltage level Vd and the reference voltage level Vref. The detection voltage level Vd may correspond to a length of a time during which the supply of the power signal is shut off. For example, the detection voltage level Vd may correspond to a power signal's off time. The reference voltage level Vref may be a criteria to determine the long power-off event.

In operation S222, the non-volatile memory device 220 may determine whether the detection voltage level Vd is higher than the reference voltage level Vref, based on the comparison operation. When the detection voltage level Vd is not higher than the reference voltage level Vref, the non-volatile memory device 220 may perform operation S223.

In operation S223, the non-volatile memory device 220 may return the fail value. For example, the non-volatile memory device 220 may include the comparator, an E-fuse circuit, and a switch control circuit. The comparator may store a comparison signal corresponding to the fail value in the E-fuse circuit. The comparator may provide the comparison signal corresponding to the fail value to the switch control circuit.

In operation S224, the non-volatile memory device 220 may turn on the switch SWx. For example, the switch control circuit receiving the comparison signal in operation S223 may turn on the switch SWx. The turned-on switch SWx may provide the power signal to a detection node such that the detection voltage level Vd of the detection node is reset.

In operation S231, the non-volatile memory device 220 may generate a dummy delay signal. For example, the non-volatile memory device 220 may generate the dummy delay signal in response to the comparison signal stored in the E-fuse circuit having the fail value.

In operation S241, the storage device 200 may process a subsequent memory operation based on the dummy delay signal.

Returning to operation S222, when the detection voltage level Vd is higher than the reference voltage level Vref, the non-volatile memory device 220 may perform operation S225.

In operation S225, the non-volatile memory device 220 may return the pass value. For example, the non-volatile memory device 220 may include the comparator, the E-fuse circuit, and the switch control circuit. The comparator may store the comparison signal corresponding to the pass value in the E-fuse circuit. The comparator may provide the comparison signal corresponding to the pass value to the switch control circuit.

In operation S226, the non-volatile memory device 220 may turn on the switch SWx. For example, the switch control circuit receiving the comparison signal in operation S225 may turn on the switch SWx. The turned-on switch SWx may provide the power signal to a detection node such that the detection voltage level Vd of the detection node is reset.

In operation S251, the storage device 200 may process the subsequent memory operation. In this case, because the comparison signal indicates the pass value, in other words, because the long power-off event does not occur, the dummy delay signal may not be generated. The storage device may process the subsequent memory operation in compliance with the default operating policy, without the dummy delay signal.

FIG. 14 is a block diagram of a storage system according to some embodiments of the present disclosure. Referring to FIG. 14, a storage system 30 may include a host device 31 and a storage device 300. The storage device 300 may include the host interface circuit HIC, the power interface circuit PIC, a storage controller 310, and a non-volatile memory device 320. The host interface circuit HIC and the power interface circuit PIC are similar to the host interface circuit HIC and the power interface circuit PIC of FIG. 5, and thus, an additional description will be omitted to avoid redundancy.

The storage controller 310 may be driven by the power signal VCCQ. Under control of the host device 31, the storage controller 310 may store data in the non-volatile memory device 320 or may read data stored in the non-volatile memory device 320.

For example, the storage controller 310 may include the power detection circuit PDC, the dummy delay circuit DDC, and the command manager CM.

The power detection circuit PDC may monitor the power interface circuit PIC. The power detection circuit PDC may determine a point in time when the power interface circuit PIC blocks the supply of the power signal VCC to the non-volatile memory device 320, based on the monitoring of the power interface circuit PIC. Additionally, the power detection circuit PDC may determine a point in time when the power interface circuit PIC re-supplies the power signal VCC to the non-volatile memory device 320, based on the monitoring of the power interface circuit PIC. The power detection circuit PDC may provide the dummy delay circuit DDC with an electrical signal indicating whether the long power-off event occurs with regard to the power signal VCC.

The dummy delay circuit DDC may generate a dummy delay signal based on the electrical signal received from the power detection circuit PDC. The dummy delay circuit DDC may provide the dummy delay signal to the command manager CM.

The command manager CM may receive the host request HRQ from the host device 31 through the host interface circuit HIC. Based on the host request HRQ, the command manager CM may store data in the non-volatile memory device 320 or may read data stored in the non-volatile memory device 320. The command manager CM may process the host request HRQ and may provide the host response HRP to the host device 31 through the host interface circuit HIC.

The command manager CM may be implemented with hardware, software, or a combination thereof. When the command manager CM is implemented by software, the command manager CM may be loaded to a volatile memory of the storage controller 310 in the form of an instruction. In this case, a processor of the storage controller 310 may implement functions of the command manager CM by executing the loaded instructions.

The command manager CM may provide the command CMD and the address ADD to the non-volatile memory device 320. The command manager CM may exchange data with the non-volatile memory device 320. The command manager CM may determine a subsequent memory operation based on the host request HRQ or the internal firmware algorithm of the storage device 300. The command manager CM may manage the subsequent memory operation based on the dummy delay signal from the dummy delay circuit DDC. For example, the command manager CM may delay the subsequent memory operation based on the dummy delay signal.

In some embodiments, the command manager CM may control a point in time when the dummy delay is to be applied, depending on a type of a subsequent memory operation. For example, when the type of the subsequent memory operation indicates an emergency type, the command manager CM may process the subsequent memory operation and may then enter the busy state. As another example, when the type of the subsequent memory operation is not the emergency type, the command manager CM may enter the busy state and may then process the subsequent memory operation after the busy state comes to an end.

The non-volatile memory device 320 may be driven by the power signals VCC and VCCQ. The non-volatile memory device 320 may perform the memory operation under control of the storage controller 310. The non-volatile memory device 320 may include a memory cell array 321. The memory cell array 321 may include a plurality of memory blocks. The plurality of memory blocks may store data.

FIG. 15 is a block diagram for describing a power detection circuit of FIG. 14, according to some embodiments of the present disclosure. Referring to FIGS. 14 and 15, the power detection circuit PDC may monitor the power interface circuit PIC. The power detection circuit PDC may communicate with the dummy delay circuit DDC. The power detection circuit PDC may include a power monitoring circuit PMC, an oscillator, a clock generator, and a counter.

The power monitoring circuit PMC may monitor the supply of the power signal VCC by the power interface circuit PIC. For example, the power interface circuit PIC may block the supply of the power signal VCC to the non-volatile memory device 320. Afterwards, when a given time passes, the power interface circuit PIC may again supply the power signal VCC to the non-volatile memory device 320. The power monitoring circuit PMC may monitor the power interface circuit PIC and may generate time point information Tp_off for a point in time corresponding to the previous shutoff of the power signal VCC and time point information Tp_on for a point in time corresponding to the supply of the power signal VCC. The time point information Tp_off may identify when the power signal VCC was last shut off. The time point information Tp_on may identify when the power signal was turned on since it was last shut off.

The oscillator may generate an oscillation signal. The oscillator may provide the oscillation signal to the clock generator.

The clock generator may generate a clock signal based on the oscillation signal. The clock generator may provide the clock signal to the counter.

The counter may receive the time point information Tp_off and the time point information Tp_on from the power monitoring circuit PMC. The counter may receive the clock signal from the clock generator. The counter may determine a counted clock number CCN indicating the number of toggling clock waveforms of the clock signal between the previous shutoff of the power signal VCC and the supply of the power signal VCC based on the time point information Tp_off and the time point information Tp_on. It is to be understood that there may be a correlation between the counted clock number CCN and a length of a time during which the power signal VCC is powered off.

The counter may store information of a reference clock number RCN. The reference clock number RCN may be a number that is used as a criteria to determine the long power-off event. The counter may generate a detection signal DS based on whether the counted clock number CCN exceeds the reference clock number RCN. The detection signal DS may be an electrical signal indicating whether or not the long power-off event occurs with regard to the power signal VCC.

For example, when the counted clock number CCN exceeds the reference clock number RCN, the counter may generate the detection signal DS indicating that the long power-off event occurs. When the counted clock number CCN does not exceed the reference clock number RCN, the counter may generate the detection signal DS indicating that the long power-off event does not occur or may not generate the detection signal DS.

The counter may provide the detection signal DS to the dummy delay circuit DDC. The dummy delay circuit DDC may generate a dummy delay signal based on the detection signal DS. The dummy delay signal may be used to delay a subsequent memory operation.

FIG. 16 is a flowchart for describing a method of operating a storage device according to some embodiments of the present disclosure. Referring to FIG. 16, the storage device 300 may communicate with a host device. The storage device 300 may include the storage controller 310 and the non-volatile memory device 320. The storage controller 310 and the non-volatile memory device 320 may respectively correspond to the storage controller 310 and the non-volatile memory device 320 of FIG. 14.

In operation S310, the storage controller 310 may monitor the power interface circuit PIC to detect a supply of the power signal VCC from the host device 31 to the non-volatile memory device 320. The storage controller 310 may determine the counted clock number CCN when the supply of the power signal VCC is detected. The counted clock number CCN may indicate the number of clock waveforms toggling between the previous shutoff of the power signal VCC and the supply of the power signal VCC thus detected. As noted above, there may be a correlation between the counted clock number CCN and a length of a time during which the supply of the power signal VCC is blocked.

In operation S320, the storage controller 310 may determine that the counted clock number CCN exceeds the reference clock number RCN. That the counted clock number CCN exceeds the reference clock number RCN may mean that the long power-off event occurs with regard to the power signal VCC.

In operation S330, the storage controller 310 may generate a dummy delay signal. The dummy delay signal may be used to delay a subsequent memory operation as much as the time interval corresponding to the delay when the long power-off event is detected.

In operation S340, the storage device 300 may manage the subsequent memory operation based on the dummy delay signal. The dummy delay signal may be managed by the storage controller 310 or the non-volatile memory device 320. Depending on whether a type of the subsequent memory operation is an emergency type, the storage device 300 may process the subsequent memory operation after applying the delay or may apply the delay after processing the subsequent memory operation.

According to an embodiment of the present disclosure, a storage device for generating a delay signal and a method of operating the same are provided.

For example, a storage device that improves the reliability of data by delaying a subsequent memory operation with a dummy delay signal and processing the subsequent memory operation in a stabilized environment, when a power signal is blocked for a long time, and a method of operating the storage device are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A method of operating a storage device which communicates with a host device, the method comprising:
 detecting a first power signal provided from the host device;
 determining whether a time interval between the detection of the first power signal and a most recent shutoff of the first power signal exceeds a reference time interval;
 generating a dummy delay signal in response to determining that the time interval exceeds the reference time interval; and
 managing a first subsequent memory operation based on the dummy delay signal.

2. The method of claim 1, wherein the first power signal corresponds to:
 a first voltage level provided to a non-volatile memory device of the storage device; or
 a second voltage level provided to the non-volatile memory device of the storage device and a storage controller of the storage device, wherein the second voltage level is lower than the first voltage level.

3. The method of claim 1, further comprising:
 managing a second subsequent memory operation based on a default operating policy, in response to determining that the time interval does not exceed the reference time interval.

4. The method of claim 1, wherein the managing of the first subsequent memory operation based on the dummy delay signal includes:

determining whether a type of the first subsequent memory operation indicates an emergency;

entering a busy state based on the dummy delay signal, in response to determining that the type of the first subsequent memory operation does not indicate the emergency; and after the busy state comes to an end, processing the first subsequent memory operation.

5. The method of claim 1, wherein the managing of the first subsequent memory operation based on the dummy delay signal includes:

determining whether a type of the first subsequent memory operation indicates an emergency;

processing the first subsequent memory operation, in response to determining that the type of the first subsequent memory operation indicates the emergency; and after the first subsequent memory operation is processed, entering a busy state based on the dummy delay signal.

6. The method of claim 1, wherein the storage device includes a non-volatile memory device configured to:

detect the first power signal;

determine whether the time interval exceeds the reference time interval; and generate the dummy delay signal in response to determining that the time interval exceeds the reference time interval.

7. The method of claim 6, wherein the determining whether the time interval exceeds the reference time interval includes:

activating a comparator of the non-volatile memory device in response to the detection of the first power signal, by a power level detection circuit of the non-volatile memory device; and generating, by the comparator, a comparison signal having a first logical value when a detection voltage level of a detection node is not higher than a reference voltage level, and wherein the generating of the dummy delay signal in response to determining that the time interval exceeds the reference time interval includes:

generating the dummy delay signal based on the comparison signal having the first logical value.

8. The method of claim 6, wherein the determining whether the time interval exceeds the reference time interval includes:

activating a comparator of the non-volatile memory device in response to the detection of the first power signal, by a power level detection circuit of the non-volatile memory device; and generating, by the comparator, a comparison signal having a second logical value when a detection voltage level of a detection node is higher than a reference voltage level, and wherein the method further comprises:

managing a second subsequent memory operation according to a default operating policy, when the comparison signal has the second logical value.

9. The method of claim 6, wherein the determining whether the time interval exceeds the reference time interval includes:

determining that the time interval exceeds the reference time interval, when a detection voltage level of a detection node is not higher than a reference voltage level, by a comparator of the non-volatile memory device; and determining, by the comparator, that the time interval does not exceed the reference time interval, when the detection voltage level of the detection node is higher than the reference voltage level, and wherein a capacitor connected between the detection node and a ground node is discharged based on a first shutoff of the first power signal and a second shutoff of a second power signal different from the first power signal.

10. The method of claim 9, wherein the first power signal corresponds to a first voltage level provided to the non-volatile memory device of the storage device, and wherein the second power signal corresponds to a second voltage level provided to the non-volatile memory device of the storage device and a storage controller of the storage device, wherein the second voltage level is lower than the first voltage level.

11. The method of claim 6, wherein the managing of the first subsequent memory operation based on the dummy delay signal includes:

managing the first subsequent memory operation based on the dummy delay signal, by the non-volatile memory device of the storage device.

12. The method of claim 6, wherein the managing of the first subsequent memory operation based on the dummy delay signal includes:

receiving the dummy delay signal from the non-volatile memory device, by a storage controller of the storage device; and managing the first subsequent memory operation based on the dummy delay signal, by the storage controller.

13. The method of claim 1, wherein the storage device includes a storage controller configured to:

detect the first power signal;

determine whether the time interval exceeds the reference time interval; and generate the dummy delay signal in response to determining that the time interval exceeds the reference time interval.

14. The method of claim 13, wherein the determining whether the time interval exceeds the reference time interval includes:

determining a counted clock number indicating the number of clock waveforms toggling between the most recent shutoff of the first power signal and the detection of the first power signal, based on information about a first point in time corresponding to the most recent shutoff of the first power signal and information about a second point in time corresponding to the detection of the first power signal, by a counter of the storage controller;

when the counted clock number exceeds a reference clock number, determining that the time interval exceeds the reference time interval; and when the counted clock number does not exceed the reference clock number, determining that the time interval does not exceed the reference time interval.

15. A storage device comprising:

a power interface circuit configured to receive a first power signal and a second power signal from a host device;

a storage controller driven by the second power signal; and a non-volatile memory device driven by the first and second power signals, wherein the non-volatile memory device includes:

a power detection circuit configured to detect a supply of at least one power signal among the first and second power signals and to generate a comparison signal indicating whether a time interval between the supply of the at least one power signal and a previous shutoff of the at least one power signal exceeds a reference time interval; and a dummy delay circuit configured to generate a dummy delay signal based on the comparison signal.

16. The storage device of claim 15, wherein the power detection circuit includes:

a power level detection circuit connected to an input node for receiving the first power signal, and configured to generate an enable signal when the supply of the first power signal is detected;

a switch connected between the input node and an internal node;

a resistor connected between the internal node and a detection node;

a capacitor connected between the detection node and a ground node;

a current source connected to the detection node, and configured to discharge the capacitor based on the second power signal;

a comparator activated in response to the enable signal and configured to generate the comparison signal having a first logical value when a detection voltage level of the detection node is not higher than a reference voltage level and to generate the comparison signal having a second logical value when the detection voltage level is higher than the reference voltage level; and a switch control circuit configured to turn on the switch in response to the comparison signal.

17. The storage device of claim 15, wherein the storage controller includes:

a first command manager configured to generate a request for a subsequent memory operation, and wherein the non-volatile memory device includes:

a second command manager configured to receive the request from the first command manager and to manage the subsequent memory operation based on the dummy delay signal.

18. The storage device of claim 15, wherein the storage controller includes a first command manager, wherein the non-volatile memory device further includes a second command manager, and wherein the first command manager is configured to:

receive the dummy delay signal from the dummy delay circuit; and manage a subsequent memory operation to be processed by the second command manager, based on the dummy delay signal.

19. A storage device comprising:

a power interface circuit configured to receive a first power signal and a second power signal from a host device;

a storage controller driven by the second power signal; and a non-volatile memory device driven by the first and second power signals, wherein the storage controller includes:

a power detection circuit configured to detect the first power signal by monitoring the power interface circuit and to generate a detection signal based on whether a time interval between the detection of the first power signal and a last shutoff of the first power signal exceeds a reference time interval; and a dummy delay circuit configured to generate a dummy delay signal based on the detection signal.

20. The storage device of claim 19, wherein the power detection circuit includes:

a power monitoring circuit configured to generate information about a first point in time corresponding to the last shutoff of the first power signal and information about a second point in time corresponding to the detection of the first power signal;

an oscillator configured to generate an oscillation signal;

a clock generator configured to generate a clock signal based on the oscillation signal; and a counter configured to determine a counted clock number indicating the number of toggling clock waveforms of the clock signal between the last shutoff of the first power signal and the detection of the first power signal based on the information about the first point in time and the information about the second point in time and to generate the detection signal based on whether the counted clock number exceeds the reference clock number.

* * * * *